United States Patent [19]
Ausschnitt et al.

[11] Patent Number: 5,712,707
[45] Date of Patent: Jan. 27, 1998

[54] EDGE OVERLAY MEASUREMENT TARGET FOR SUB-0.5 MICRON GROUND RULES

[75] Inventors: Christopher P. Ausschnitt, Brookfield, Conn.; William A. Muth, Lagrangeville, N.Y.

[73] Assignee: International Business Machines Corporation, Armonk, N.Y.

[21] Appl. No.: 560,720

[22] Filed: Nov. 20, 1995

[51] Int. Cl.[6] .................................................. G01B 11/00
[52] U.S. Cl. .......................... 356/401; 356/399; 250/548; 148/DIG. 102
[58] Field of Search ............................. 356/363, 399, 356/400, 401; 250/548; 437/924; 148/DIG. 102

[56] References Cited

U.S. PATENT DOCUMENTS

| | | |
|---|---|---|
| 4,529,314 | 7/1985 | Ports . |
| 4,568,189 | 2/1986 | Bass et al. . |
| 4,820,055 | 4/1989 | Miller . |
| 4,908,656 | 3/1990 | Suwa et al. .......................... 356/401 |
| 5,216,257 | 6/1993 | Brueck et al. . |
| 5,262,258 | 11/1993 | Yanagisawa . |
| 5,402,224 | 3/1995 | Hirukawa et al. . |

*Primary Examiner*—Georgia Y. Epps
*Assistant Examiner*—Robert Kim
*Attorney, Agent, or Firm*—DeLio & Peterson, LLC; Peter W. Peterson; Alison D. Mortinger

[57] ABSTRACT

A target for determining bias or overlay error in a substrate formed by a lithographic process uses a pair of straight vernier arrays of parallel elements, a staggered vernier array of parallel elements, and optionally at least one image shortening array on the substrate. The ends of the elements form the array edges. The vernier arrays are overlaid such that: i) the elements of the straight and staggered arrays are substantially parallel; ii) one of the edges of the staggered array intersects with one of the edges of one the straight arrays; and iii) the other of the edges of the staggered array intersects with one of the edges of the other of the straight arrays. Bias or overlay error is determined by: i) locating the points of intersection of the edges of the second vernier array with the edges of the first vernier arrays and measuring the degree of separation of the intersection points, and ii) measuring the separation between adjacent edges of the image shortening array and the one of the first or second vernier arrays having corresponding element width and element spacing. Preferably, the location of the intersection points is measured relative to a fixed point on one of the arrays. Bias is proportional to the difference between the locations of the intersection points relative to a fixed point on one of the arrays. Overlay error is proportional to the sum of the locations of the intersection points relative to a fixed point on one of the arrays. A moiré fringe pattern may be created by the degree of overlap of the straight and staggered arrays, and bias or overlay error may also be determined by measuring the fringe created in the moiré fringe pattern.

33 Claims, 19 Drawing Sheets

Ln = Nominal Length
Lp = Printed Length
Wn = Nominal Width
Wp = Printed Width

FIG. 19A
FIG. 19B
FIG. 19C
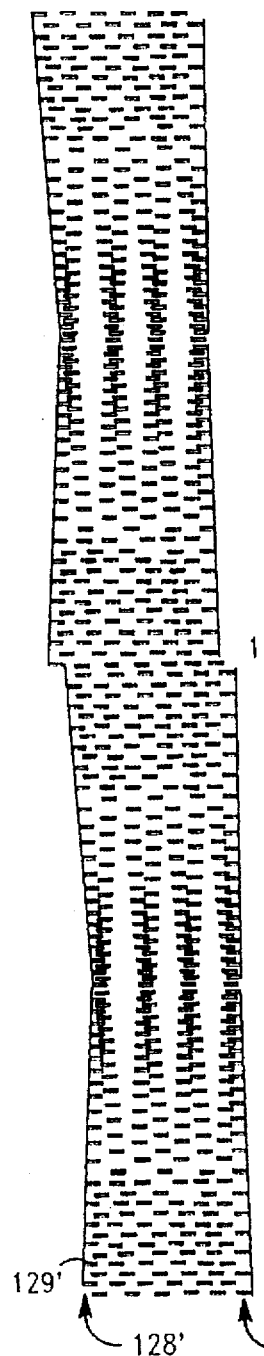
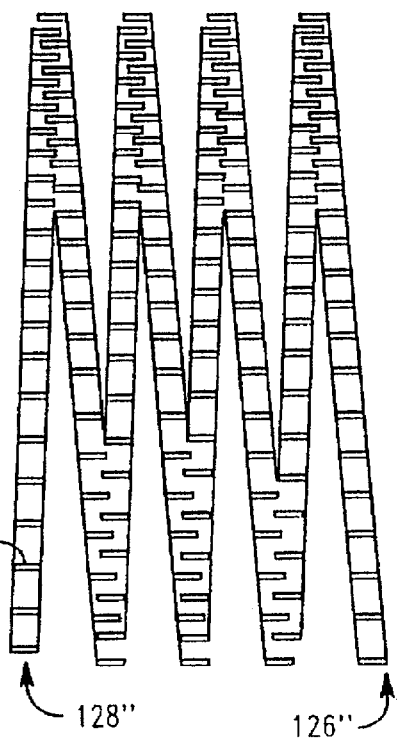
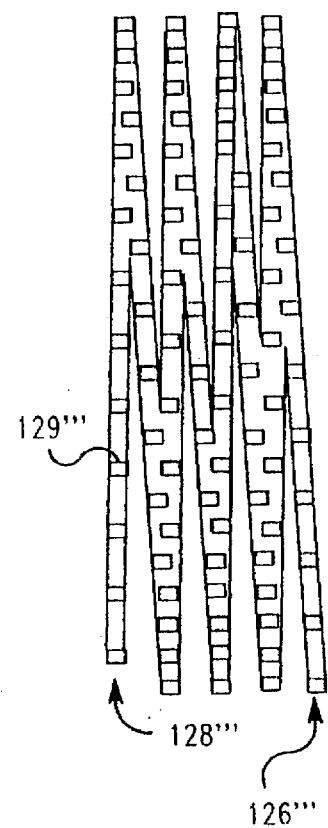

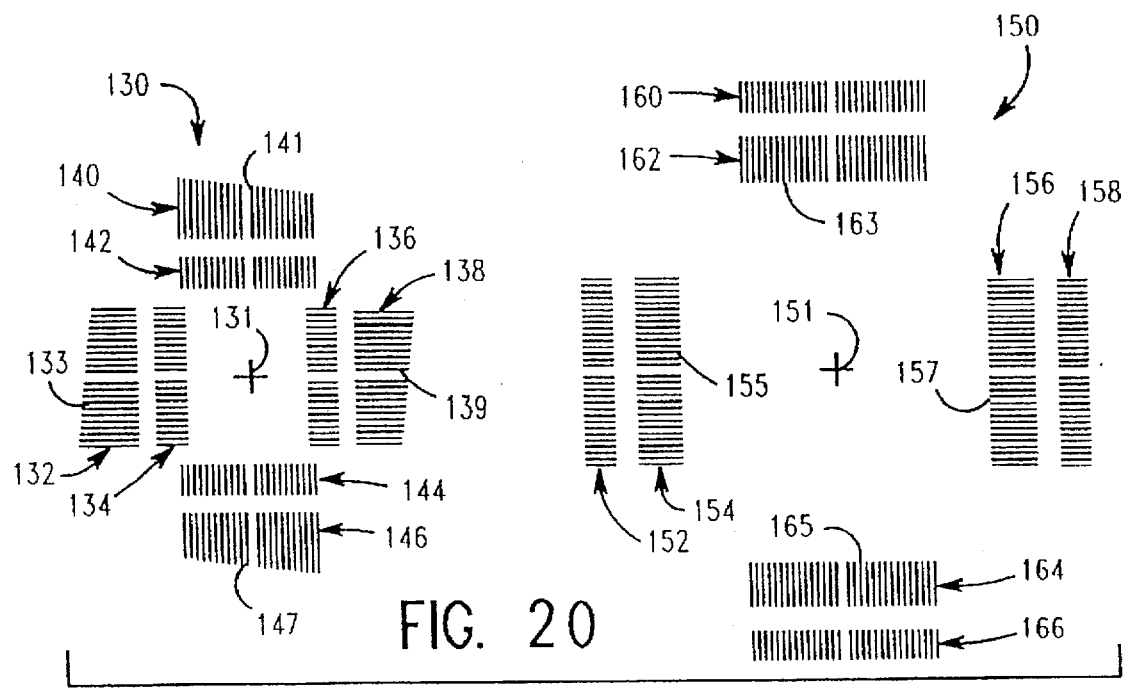
FIG. 20
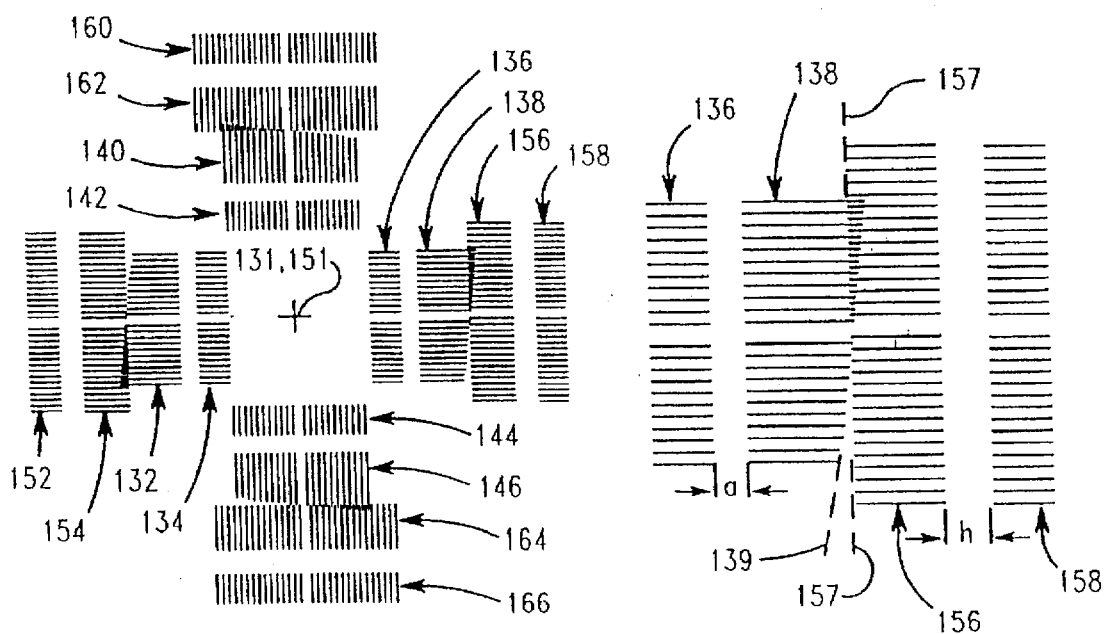
FIG. 21
FIG. 22

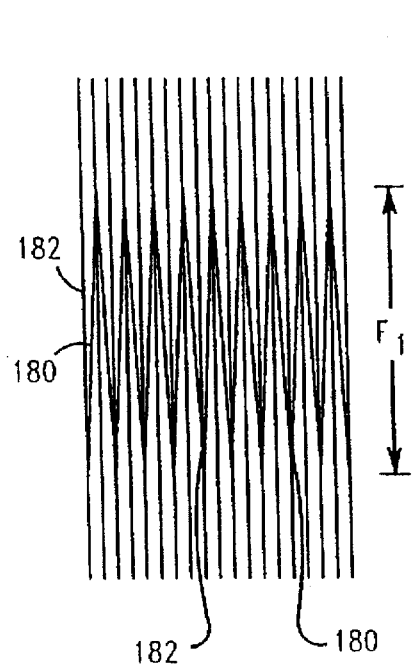
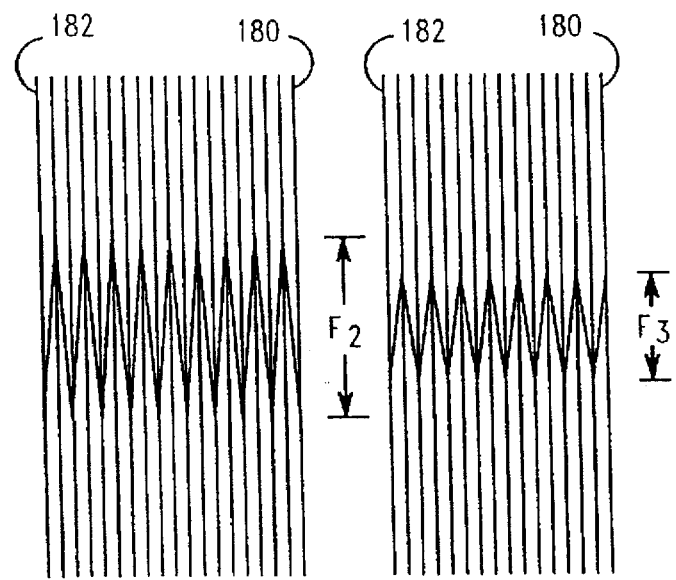
FIG. 23    FIG. 24    FIG. 25

EDGE OVERLAY MEASUREMENT TARGET FOR SUB-0.5 MICRON GROUND RULES

BACKGROUND OF THE INVENTION

1. Field of the Invention

The present invention relates generally to manufacturing processES requiring lithography and, more particularly, to monitoring of bias and overlay error in lithographic and etch processes used in microelectronics manufacturing which is particularly useful for monitoring pattern features with dimensions on the order of less than 0.5 micron.

2. Description of Related Art

Lithography has a broad range of industrial applications, including the manufacture of semiconductors, flat-panel displays, micromachines, and disk heads.

The lithographic process allows for a mask or reticle pattern to be transferred via spatially modulated light (the aerial image) to a photoresist film on a substrate. Those segments of the absorbed aerial image, whose energy exceeds a threshold energy of chemical bonds in the photo-active component (PAC) of the photoresist material, create a latent image in the photoresist. In some photoresist systems the latent image is formed directly by the PAC. In others (so-called acid catalyzed photoresists), the photo-chemical interaction first generates acids which react with other photoresist components during a post-exposure bake to form the latent image. In either case, the latent image marks the volume of photoresist material that either is removed during the development process (in the case of positive photoresist) or remains after development (in the case of negative photoresist) to create a three-dimensional pattern in the photoresist film.

The principal determinant of the photoresist image is the surface on which the exposure energy equals the photoresist threshold energy in the photoresist film. "Exposure" and "focus" are the variables that control the shape of this surface. Exposure, set by the illumination time and intensity, determines the average energy of the aerial image per unit area. Local variations in exposure can be caused by variations in substrate reflectivity and topography. Focus, set by the position of the photoresist film relative to the focal plane of the imaging system, determines the decrease in modulation relative to the in-focus image. Local variations in focus can be caused by variations in substrate film thickness and topography.

Generally, because of the variations in exposure and focus, patterns developed by lithographic processes must be continually monitored or measured to determine if the dimensions of the patterns are within acceptable range. The importance of such monitoring increases considerably as the resolution limit, which is usually defined as minimum features size resolvable, of the lithographic process is approached. The patterns being developed in semiconductor technology are generally in the shape of lines both straight and with bends, having a length dimension equal to and multiple times the width dimension. The width dimension, which by definition is the smaller dimension, is of the order of 0.1 micron to greater than 1 micron in the current leading semiconductor technology. Because the width dimension is the minimum dimension of the patterns, it is the width dimension that challenges the resolution limits of the lithographic process. In this regard, because width is the minimum and most challenging dimension to develop, it is the width dimension that is conventionally monitored to assess performance of the lithographic process. The term "bias" is used to describe the change in a dimension of a feature from its nominal value. Usually the bias of interest is the change in the smallest of the dimensions of a given feature. Further, the word "bias" is invariably used in conjunction with a process such as resist imaging, etching, developing etc. and described by terms such as image bias, etch bias, print bias etc.

Monitoring of pattern features and measurement of its dimensions (metrology) is typically performed using either a scanning electron microscope (SEM) or an optical tool. SEM metrology has very high resolving power and is capable of resolving features of the order of 0.1 micron. Unfortunately, SEM metrology is expensive to implement, relatively slow in operation and difficult to automate. Although optical metrology overcomes the above drawbacks associated with SEM metrology, optical metrology systems are unable to resolve adequately for measurement of feature dimensions of less than about 1 micron. Thus, optical metrology systems are unable to resolve state-of-the art circuit line width dimensions, which are currently on the order of less than 1 micron.

Accordingly, there is still a need for a method of monitoring pattern features with dimensions on the order of less than 1 micron, and which is inexpensive to implement, fast in operation and simple to automate.

In addition to measuring critical dimension and bias in pattern features, it is important to be able to determine the accuracy of pattern overlay when depositing successive layers on a substrate. Edge overlay is determined by level-to-level image size bias and overlay error, and are key to device functionality. Current techniques do not lend themselves to measure accurately or easily the proximity of edges of successive pattern levels. Where verniers have been used in monitoring lithographic processes, they have not monitored length of the feature at minimum width, which the present inventor has found to be the most sensitive indicator of process variation. Additionally, vernier designs often violate product ground rules in the submicron regime.

Prior art optical metrology tools which have been designed for automated measurement utilize conventional box-in-box or bar-in-bar targets. While prior art bar-in-bar targets have been used because they can approximate product ground rules, below 0.51 µm ground rules such prior art bar-in-bar overlay measurement target dimensions have had to exceed product ground rules to stay within optical metrology tool resolution. This has resulted in process anomalies in the vicinity of overlay targets which degrade measurement accuracy. Prior art target designs have not included human-readable verniers to complement automated measurements, and have not enabled measurement of critical dimensions on the overlay target, which has precluded the simultaneous determination of critical dimension and overlay variations which contribute to edge overlay error. Additionally, there is significant waste in substrate "real estate" when both machine readable and human readable targets have been employed.

Bearing in mind the problems and deficiencies of the prior art, it is therefore an object of the present invention to provide a method and target for determining bias and overlay error in patterns deposited as a result of lithographic processes.

It is another object of the present invention to provide a method and target which combines measurement of bias and overlay error in deposited patterns.

A further object of the invention is to provide bias and edge overlay targets which utilize little space on a wafer substrate.

It is yet another object of the present invention to provide bias and edge overlay targets which are human readable during substrate processing.

Still other objects and advantages of the invention will in part be obvious and will in part be apparent from the specification.

SUMMARY OF THE INVENTION

The above and other objects, which will be apparent to those skilled in the art, are achieved in the present invention which relates in one aspect to a method of measuring bias of a minimum feature in a lithographic process by creating an array of elements having a width and space corresponding to the minimum feature, and a length. The length change of the array element resulting from image shortening effect from a lithographic process is measured and the bias of the element in the width dimension is calculated. A test site having groups of array elements is described which facilitate automatic bias measurement of array lengths and separations and especially allows the use of non SEM metrology tools which is otherwise incapable of measuring the minimum feature width being monitored. Measurements by this method and test site used to control lithographic processing of substrates in manufacturing, routine monitoring of product substrates and lithographic tool and process of minimum bias, are disclosed.

In another aspect, the present invention provides a method of determining bias or overlay error in a substrate formed by a lithographic process by initially creating a pair of first vernier arrays of elements on the substrate. Each first array comprises a plurality of spaced, substantially parallel elements which have a length and a width. The ends of each element in each first array are aligned along straight lines parallel to each other at a first angle to the length of each element and form an array edge. The first arrays are spaced from each other and having substantially parallel array edges. There is also created at least one second vernier array of elements on the substrate, the second array comprising a plurality of spaced, substantially parallel elements having a length and a width. The ends of the elements of the second array are aligned along straight lines parallel to each other at a second angle to the length of each element and forming at least two array edges.

The method includes overlying the first and second arrays such that: i) the elements of the first and second arrays are substantially parallel; ii) one of the edges of the second array intersects with one of the edges of one the first arrays; and iii) the other of the edges of the second array intersects with one of the edges of the other of the first arrays. Bias or overlay error is determined by locating the points of intersection of the edges of the second array with the edges of the first arrays and measuring the degree of separation of the intersection points. Preferably, the location of the intersection points are measured relative to a fixed point on one of the arrays. Bias is proportional to the difference between the locations of the intersection points relative to a fixed point on one of the arrays while overlay error is proportional to the sum of the locations of the intersection points relative to a fixed point on one of the arrays.

Bias or overlay error may be determined in the X direction by aligning the length of the elements of the arrays parallel to an X-axis. Bias or overlay error may be determined in the Y direction in an analogous manner by creating third and fourth arrays, corresponding to the first and second arrays, respectively, such that the elements of the third and fourth arrays are parallel to a Y-axis, and repeating the measurement of bias or overlay error in the Y direction.

The first and second vernier arrays may be created with already interlocking exposures on the same level on the substrate, or the first and second vernier arrays may created on the same substrate level by stepping exposures to interlock the arrays of the vernier. The first and second arrays may also be created on different levels on the substrate.

In a further aspect, the present invention relates to a target for determining bias or overlay error in a substrate formed by a lithographic process. The target includes a pair of first vernier arrays of elements on the substrate, with each first array comprising a plurality of spaced, substantially parallel elements having a length and a width. The ends of each element in each first array are aligned along straight lines parallel to each other at a first angle to the length of each element and forming an array edge. The first arrays are spaced from each other and have substantially parallel array edges. The target also includes at least one second vernier array of elements on the substrate, with the second array comprising a plurality of spaced, substantially parallel elements having a length and a width. Ends of the elements of the second array are aligned along straight lines parallel to each other at a second angle to the length of each element and form at least two array edges.

The first and second vernier arrays overlie each other such that: i) the elements of the first and second arrays are substantially parallel; ii) one of the edges of the second array intersects with one of the edges of one the first arrays; and iii) the other of the edges of the second array intersects with one of the edges of the other of the first arrays. Bias or overlay error is determinable according to the above-recited method by locating the points of intersection of the edges of the second array with the edges of the first arrays and measuring the degree of separation of the intersection points.

The width of each of the elements may correspond to the minimum critical dimension of the lithographic process. Preferably, the width of each of the elements is less than the length of each element, the width and spacing of the elements in the first and second arrays are equal and the elements in each of the spaced first arrays are substantially aligned with each other. The target may be constructed such that the first angle is 90 degrees and the second angle is greater or less than 90 degrees, or such that the second angle is 90 degrees and the first angle is greater or less than 90 degrees.

The target may be oriented such that the length of the elements of the arrays are parallel to an X-axis for determining the bias or overlay error in the X direction. To determine bias or overlay error in the Y direction, the target includes third and fourth arrays, corresponding to the first and second arrays, respectively, such that the elements of the third and fourth arrays are parallel to a Y-axis.

In a yet another aspect, the present invention relates to a method of determining bias or overlay error in a substrate formed by a lithographic process by creating a pair of first vernier arrays of elements, at least one second vernier array of elements, and at least one image shortening array on the substrate. Each first vernier array comprises a plurality of spaced, substantially parallel elements having a length and a width, with ends of each element in each first array being aligned along straight lines parallel to each other at a first angle to the length of each element and forming an array edge. The first arrays are spaced from each other and having substantially parallel array edges. The second vernier array comprise a plurality of spaced, substantially parallel elements having a length and a width, with ends of the elements being aligned along straight lines parallel to each other at a second angle to the length of each element and forming at least two array edges. At least one of the first or second vernier arrays have element width and spacing between adjacent elements which corresponds to a minimum feature formed in the lithographic process.

The image shortening array comprises a plurality of spaced, substantially parallel elements having a length and a width, with the element width and spacing between adjacent elements corresponding to a minimum feature formed in the lithographic process. The image shortening array has ends of the elements forming an array edge spaced from the edge of the first or second vernier arrays having corresponding element width and element spacing In practicing the method, the first and second vernier arrays are overlaid such that: i) the elements of the first and second arrays are substantially parallel; ii) one of the edges of the second array intersects with one of the edges of one the first arrays; and iii) the other of the edges of the second array intersects with one of the edges of the other of the first arrays. Bias or overlay error is determined by: i) locating the points of intersection of the edges of the second vernier array with the edges of the first vernier arrays and measuring the degree of separation of the intersection points, and ii) measuring the separation between adjacent edges of the image shortening array and the one of the first or second vernier arrays having corresponding element width and element spacing. Preferably, the location of the intersection points is measured relative to a fixed point on one of the arrays. Bias is proportional to the difference between the locations of the intersection points relative to a fixed point on one of the arrays. Overlay error is proportional to the sum of the locations of the intersection points relative to a fixed point on one of the arrays.

The lengths of the elements of the arrays may be aligned parallel to an X-axis to determine the bias or overlay error in the X direction. Additional vernier and image shortening arrays may be created with elements whose lengths are parallel to a Y-axis to determine the bias or overlay error in the Y direction.

The first and second vernier arrays may be created with already interlocking exposures on the same level on the substrate, or the first and second vernier arrays may created on the same substrate level by stepping exposures to interlock the arrays of the vernier. The first and second arrays may also be created on different levels on the substrate.

In yet a further aspect, the present invention relates to a target for determining bias or overlay error in a substrate formed by a lithographic process. The target includes a pair of first vernier arrays of elements, at least one second vernier array of elements, and at least one image shortening array on the substrate. Each first vernier array comprises a plurality of spaced, substantially parallel elements having a length and a width. The ends of each element in each first array are aligned along straight lines parallel to each other at a first angle to the length of each element and form an array edge. The first arrays are spaced from each other and have substantially parallel array edges. The second vernier array comprises a plurality of spaced, substantially parallel elements having a length and a width, with ends of the elements being aligned along straight lines parallel to each other at a second angle to the length of each element and forming at least two array edges. At least one of the first or second vernier arrays has element width and spacing between adjacent elements corresponding to a minimum feature formed in the lithographic process. The first and second vernier arrays overlie each other such that: i) the elements of the first and second arrays are substantially parallel; ii) one of the edges of the second array intersects with one of the edges of one the first arrays; and iii) the other of the edges of the second array intersects with one of the edges of the other of the first arrays.

The image shortening array comprises a plurality of spaced, substantially parallel elements having a length and a width. The element width and spacing between adjacent elements corresponds to a minimum feature formed in the lithographic process. The image shortening array has ends of the elements forming an array edge spaced from the edge of the first or second vernier arrays having corresponding element width and element spacing;

Bias or overlay error is determinable according to the above-recited method by: i) locating the points of intersection of the edges of the second vernier array with the edges of the first vernier arrays and measuring the degree of separation of the intersection points, and ii) measuring the separation between adjacent edges of the image shortening array and the one of the first or second vernier arrays having corresponding element width and element spacing.

Preferably, the width of each of the elements corresponds to the minimum critical dimension of the lithographic process, the width of each of the elements is less than the length of each element and the width and spacing of the elements in the arrays are equal. Also, it is preferred that the elements in each of the spaced first vernier arrays and the image shortening array be substantially aligned with each other.

The target may be constructed such that the first vernier angle is 90 degrees and the second vernier angle is greater or less than 90 degrees, or such that the second vernier angle is 90 degrees and the first vernier angle is greater or less than 90 degrees.

The length of the elements of the target arrays may be aligned parallel to an X-axis for determining the bias or overlay error in the X direction. There may be provided additional vernier and image shortening arrays having elements whose lengths are parallel to a Y-axis for determining the bias or overlay error in the Y direction.

A method of determining bias or overlay error by a measurable moiré fringe effect in a substrate formed by a lithographic process is also provided by the present invention. The method comprises creating a plurality of first arrays of elements and a plurality of second arrays of elements on a substrate. Each first array comprises a plurality of spaced, substantially parallel elements having a length and a width, with ends of each element in each first array being aligned along straight lines parallel to each other at a first angle to the length of each element and forming edges for each of the first arrays. The first arrays are spaced from each other and have substantially parallel array edges. Each second array comprises a plurality of spaced, substantially parallel elements having a length and a width, with ends of each element in each second array being aligned along straight lines parallel to each other at a second angle to the length of each element and forming edges for each of the second arrays. The second arrays are spaced from each other and having substantially parallel array edges.

In practicing the method, the first and second arrays are overlaid such that: i) the elements of the first and second arrays are substantially parallel; ii) the edges of the second arrays intersect with the edges of the first arrays. A moiré fringe pattern is created by the degree of overlap of the first and second arrays. The length of each element in the first and second arrays determines the size of the moiré fringe. Bias or overlay error is determined by measuring the fringe created in the moiré fringe pattern.

Preferably, the width of each of the elements corresponds to the minimum critical dimension of the lithographic process. It is also preferred that the width and spacing of the elements in the first and second arrays are equal and the width of each of the elements is less than the length of each element. The first and second arrays may be created on the same level on the substrate or may be created on different levels on the substrate.

A target for determining overlay error in a substrate formed by a lithographic process is also provided which comprises first and second sets of image shortening arrays on the substrate. Each image shortening array comprises a plurality of spaced, substantially parallel elements having a length and a width, the element width and spacing between adjacent elements corresponding to a minimum feature formed in the lithographic process. The ends of said elements said form the image shortening array edges. The first set of image shortening arrays are located on one level of the substrate and comprise a first pair of said arrays having substantially parallel array edges and spaced from each other in an X direction and a second pair of said arrays having substantially parallel array edges and spaced from each other in a Y direction. The second set of image shortening arrays are located on another level of the substrate and comprising a third pair of said arrays having substantially parallel array edges and spaced from each other in an X direction different from the X direction spacing of the first pair of arrays and a fourth pair of said arrays having substantially parallel array edges and spaced from each other in a Y direction different from the Y direction spacing of the second pair of arrays. The first and second sets of arrays are overlaid such that each of the first and third pairs of arrays are separated in the X direction and each of the second and fourth pairs of arrays are separated in the Y direction. Overlay error is determined by determining the center of each set of image shortening arrays using edges of each pair of arrays and measuring any difference between the centers of said first and second set of image shortening arrays. Preferably, width of each of said elements corresponds to the minimum critical dimension of the lithographic process. Also, it is preferred that the width of each of said elements is less than the length of each element, the width and spacing of said elements in said arrays are equal, and the elements in each of said image shortening arrays are substantially aligned with each other.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

The file of this patent contains at least one drawing executed in color. Copies of this patent with color drawing (s) will be provided by the Patent & Trademark Office upon request and payment of the necessary fee.

FIGS. 19a, 19b and 19c are a series of vernier markings having different element length to array spacing relationships.

FIG. 20 depicts two target portions, created on separate layers of a substrate, which combine vernier and image shortening effect markings.

FIG. 21 is a target created by overlying the target portions of FIG. 21 on adjacent substrate layers to measure bias and/or overlay errors.

FIG. 22 is an enlarged portion of the combined target of FIG. 21.

FIGS. 23, 24 and 25 depict moiré fringe pattern-type effects observable with verniers utilizing image shortening effect markings to measure bias and/or overlay errors.

DETAILED DESCRIPTION OF THE PREFERRED EMBODIMENTS

In describing the preferred embodiment of the present invention, reference will be made herein to FIGS. 1–25 of the drawings in which like numerals refer to like features of the invention.

Image Shortening Effect

The present invention incorporates novel methods and procedures for monitoring features during lithography by extensively characterizing the phenomenon of "image shortening". As such, a brief discussion of the image shortening concept is provided herein below to help understand the present invention.

Figure 1:
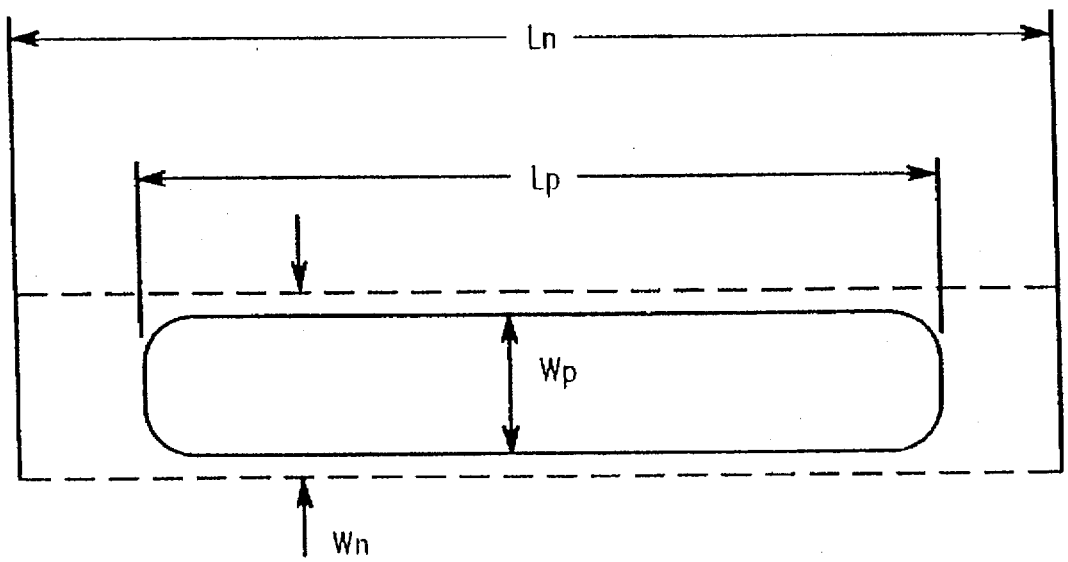
FIG. 1 is a schematic illustration of image shortening effect.

Referring to FIG. 1, for a line or space, whose nominal length ($L_n$) is greater than its nominal width ($W_n$), the pattern imaged by a lithography tool in photoresist will have printed dimensions $L_p$, $W_p$. Image shortening or foreshortening describes the case where the print bias of the length $(L_n-L_p)$ exceeds the print bias of the width $(W_n-W_p)$. The present inventor has found that the image shortening effect becomes pronounced as the resolution limit of the lithography tool/process is approached.

Figure 2A:
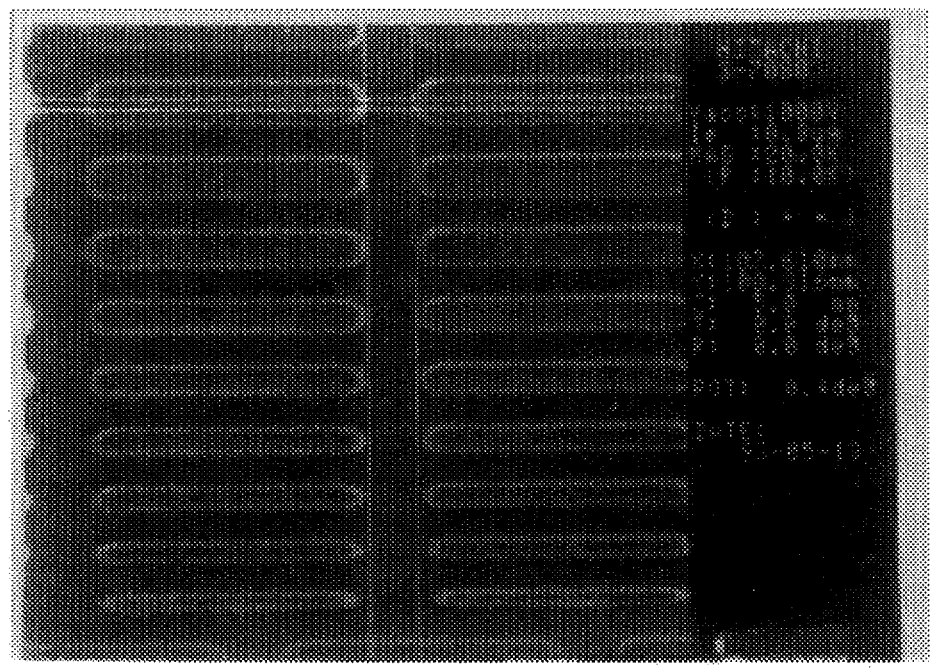
FIG. 2 is a top-down SEM photographic of lines illustrating the image shortening effect and FIG. 2B is a plot of measured separation data using test site of FIG. 2A.
Figure 2B:
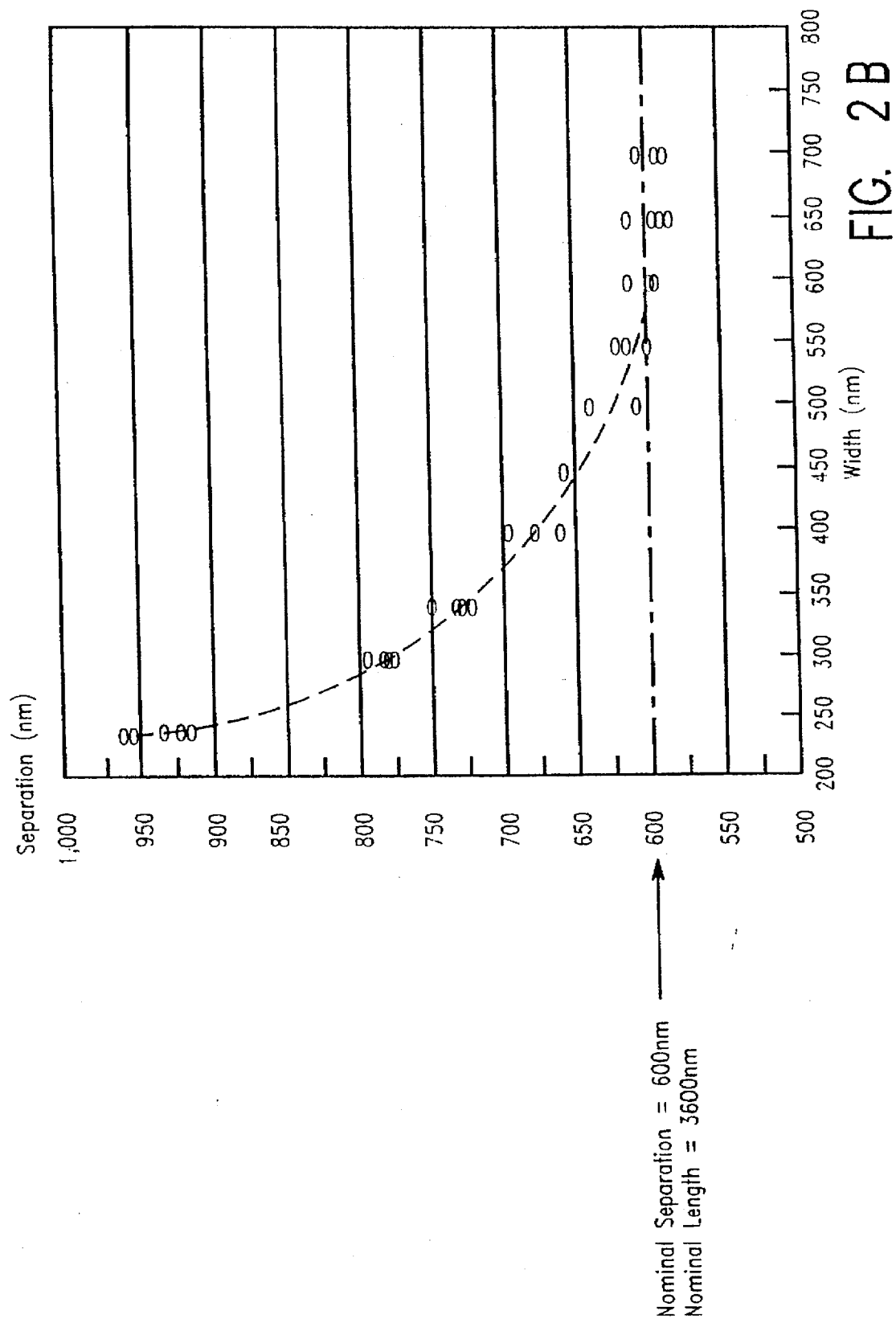
Figure 3:
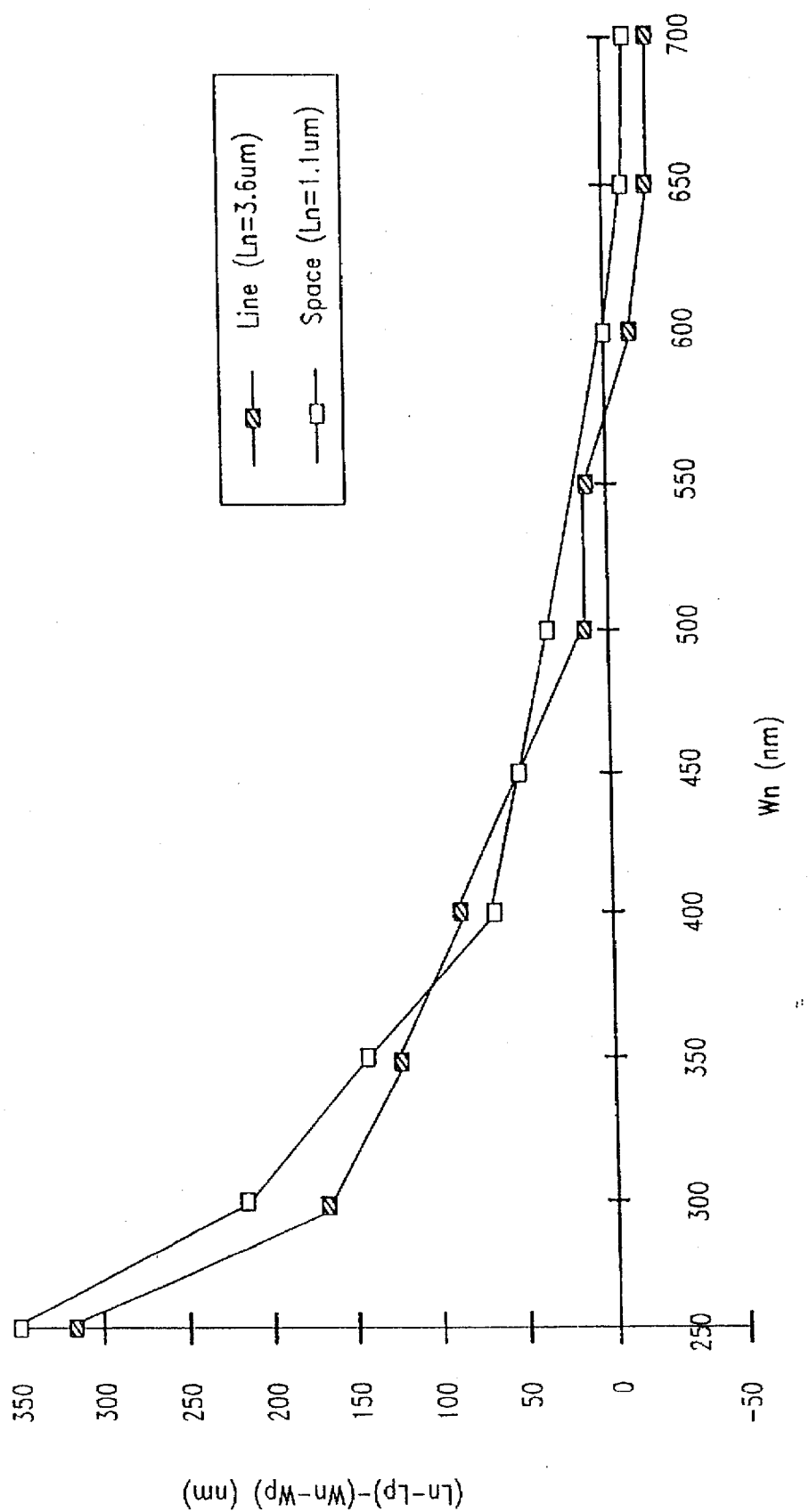
FIG. 3 is a plot of image shortening effect on a line and space as a function of its width.
Figure 4:
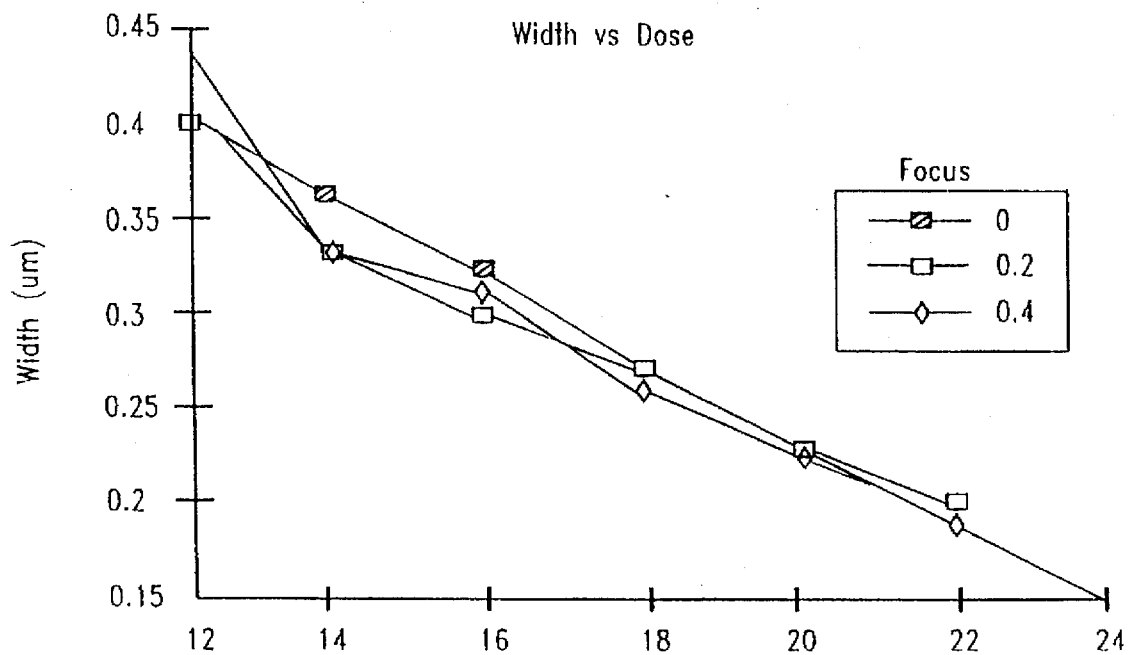
FIG. 4A and 4B are plots of measured effect on width and length as a function of exposure dosage for different image focus.
Figure 4:
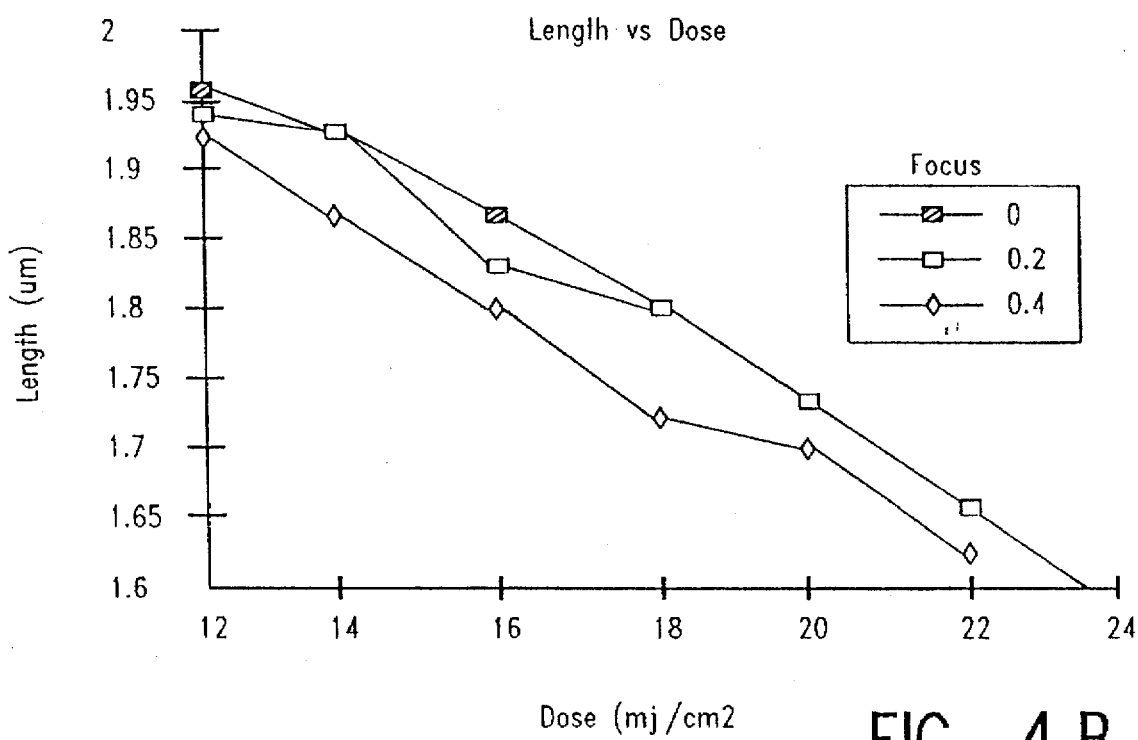

FIG. 2A is a top-down SEM photograph of two arrays of lines used to characterize the image shortening effect. The array element widths varied over a wide range 250 nm to 700 nm that are part of the test pattern in FIG. 2A. The image shortening effect is measured in this case by the change in the separation between corresponding elements of the arrays, which is roughly the same as the change in line length. FIG. 2B is a plot of the experimental measurement of the image shortening as a function of minimum width of the feature from arrays such as shown in FIG. 2A. It can be observed that as the printed line width decreases from top to bottom of the photograph, the line ends deviate further from the parallel display cursors. It should be understood that at any width, the process conditions which includes exposure, focus and develop process can be adjusted to change the value of the image shortening. The plot of FIG. 3 illustrates that as the width of a line decreases, the bias of the length dimension actually increases over that of width or minimum feature bias. Accordingly, the present inventors have shown that length bias measurement can be advantageously used to characterize minimum feature bias in a lithographic process as the measurable quantity is larger and therefore easier to measure.

Factors that contribute to image shortening include the following:

(1) The corners that must form the ends of the line or space contribute higher spatial frequency components relative to the middle of the line or space. Consequently, a given imaging system cannot resolve the ends as well as the middle, and a portion of the shortening is present in the aerial image.

(2) The photoactive compound (PAC) is the key chemical component for image formation in all photoresists. Diffusion of the PAC occurs within the photoresist film during expose and post-expose-bake processes. This diffusion will enhance the shortening as the width of the line or space approaches the diffusion length.

(3) The mask itself can contribute to shortening due to the resolution/process limitations inherent in mask patterning. these effects will be most severe for 1× masks, but can also be significant on 5× or 10× masks in the form of corner rounding and/or foreshortening on the mask. Corner rounding on the mask will enhance the shortening present in the aerial image of the lithography tool.

(4) Resist stress relief at develop could also lead to shortening effects.

The present inventor has measured extensively the increased sensitivity of the length dimension to exposure and focus variation relative to the width dimension. For example, the experimental data in FIGS. 4A and 4B shows the effect of exposure dosage on the width and length dimension of a line for different focus conditions. From the data, comparing the dependence of the length dimension on exposure to that of the width, where the nominal line width is 250 nm and the nominal line length is 2 μm, it can be concluded that the sensitivity of the width bias to exposure (slope) is approximately 17 nm/mj/cm$^2$, and the sensitivity of the length bias to exposure (slope) is approximately 29 nm/mj/cm$^2$. Thus, the length shows approximately 1.7× greater sensitivity to exposure variation than does the width. For a given process, the magnitude of this sensitivity factor is dependent on factors that affect image shortening as described above.

Figure 5:
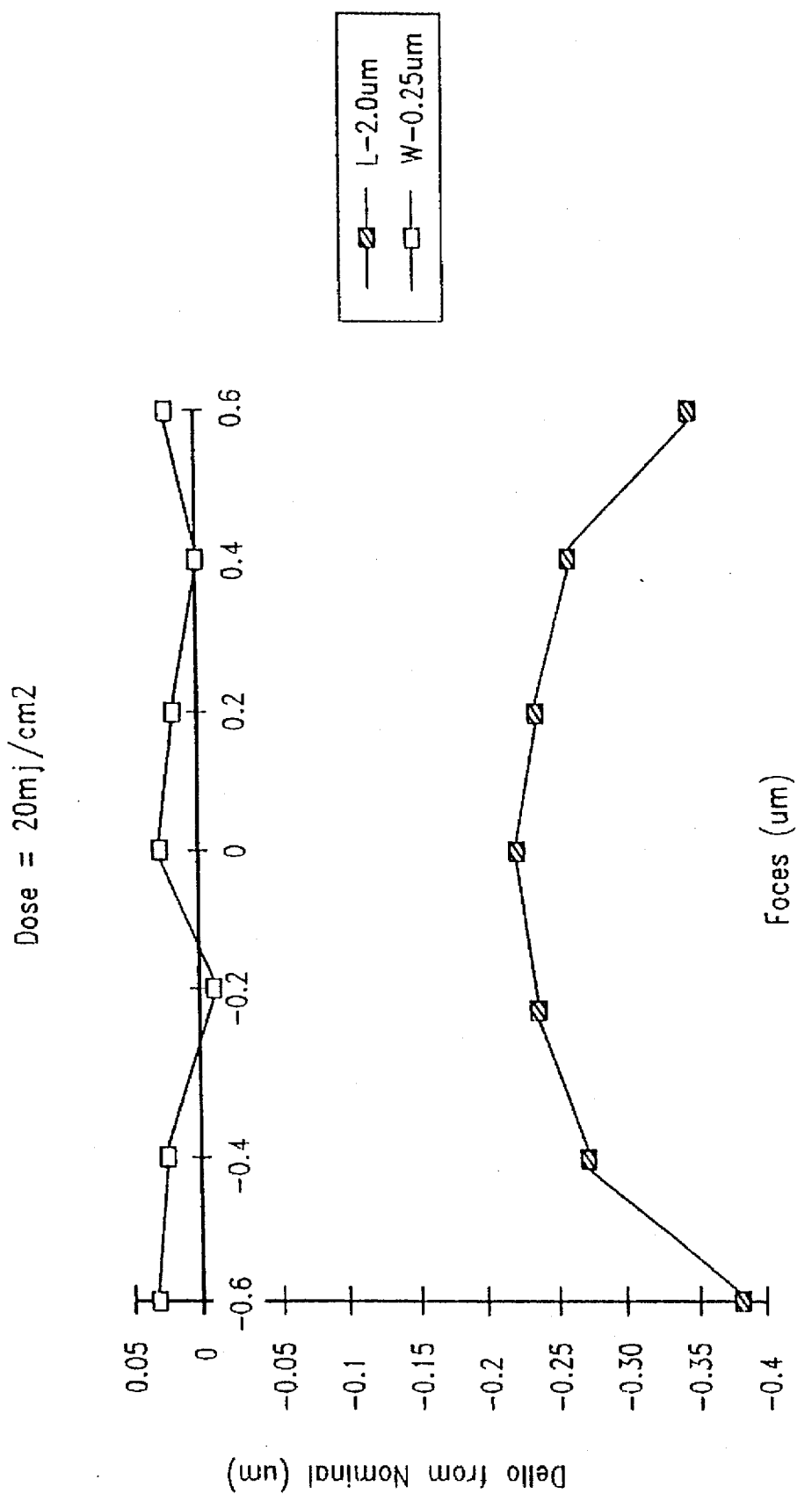
FIG. 5 is a plot of the effect of defocus on deviation in width and length from nominal values.
Figure 6:
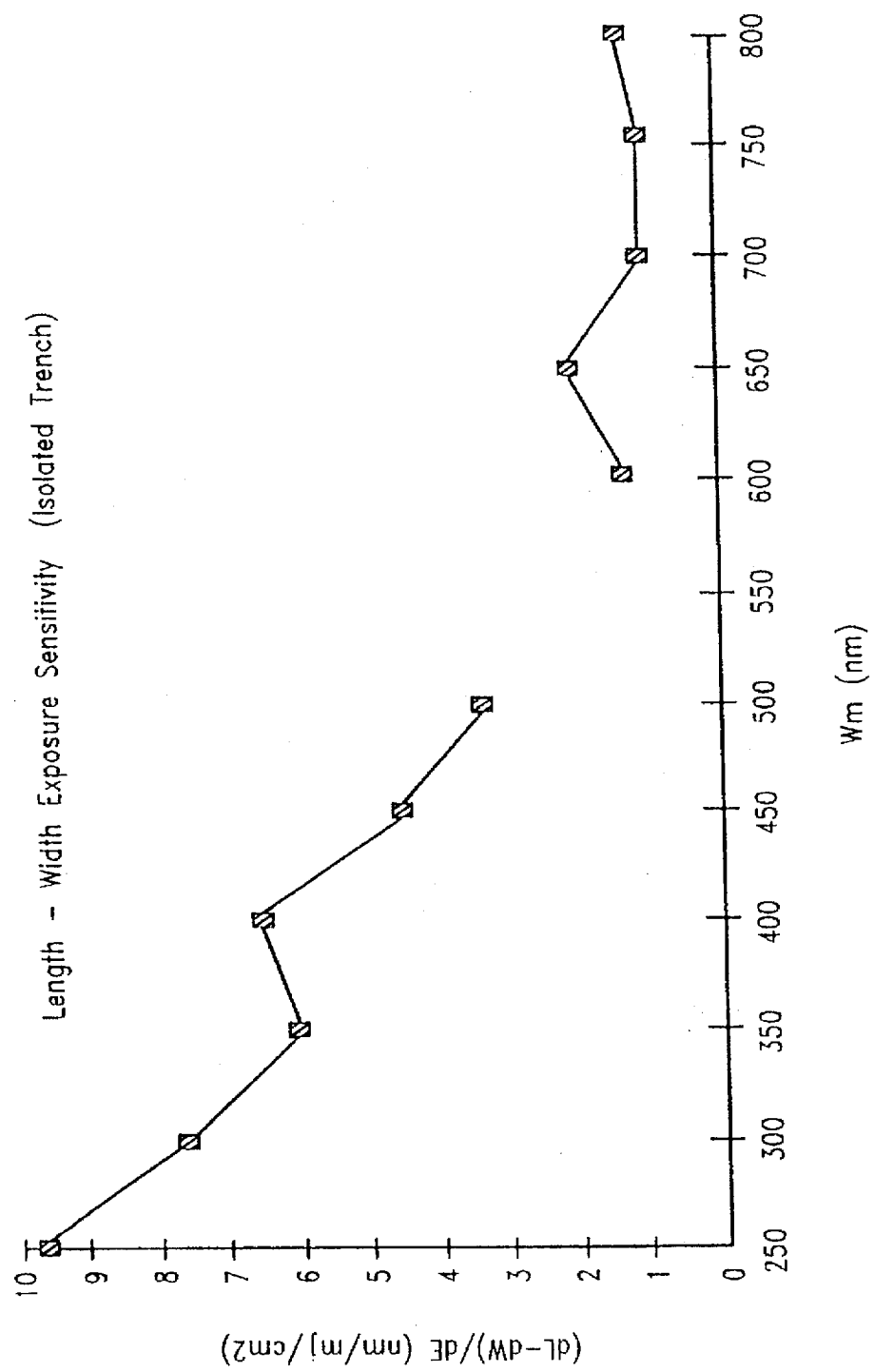
FIG. 6 is a plot of length-width sensitivity to exposure dosage.
Figure 7:
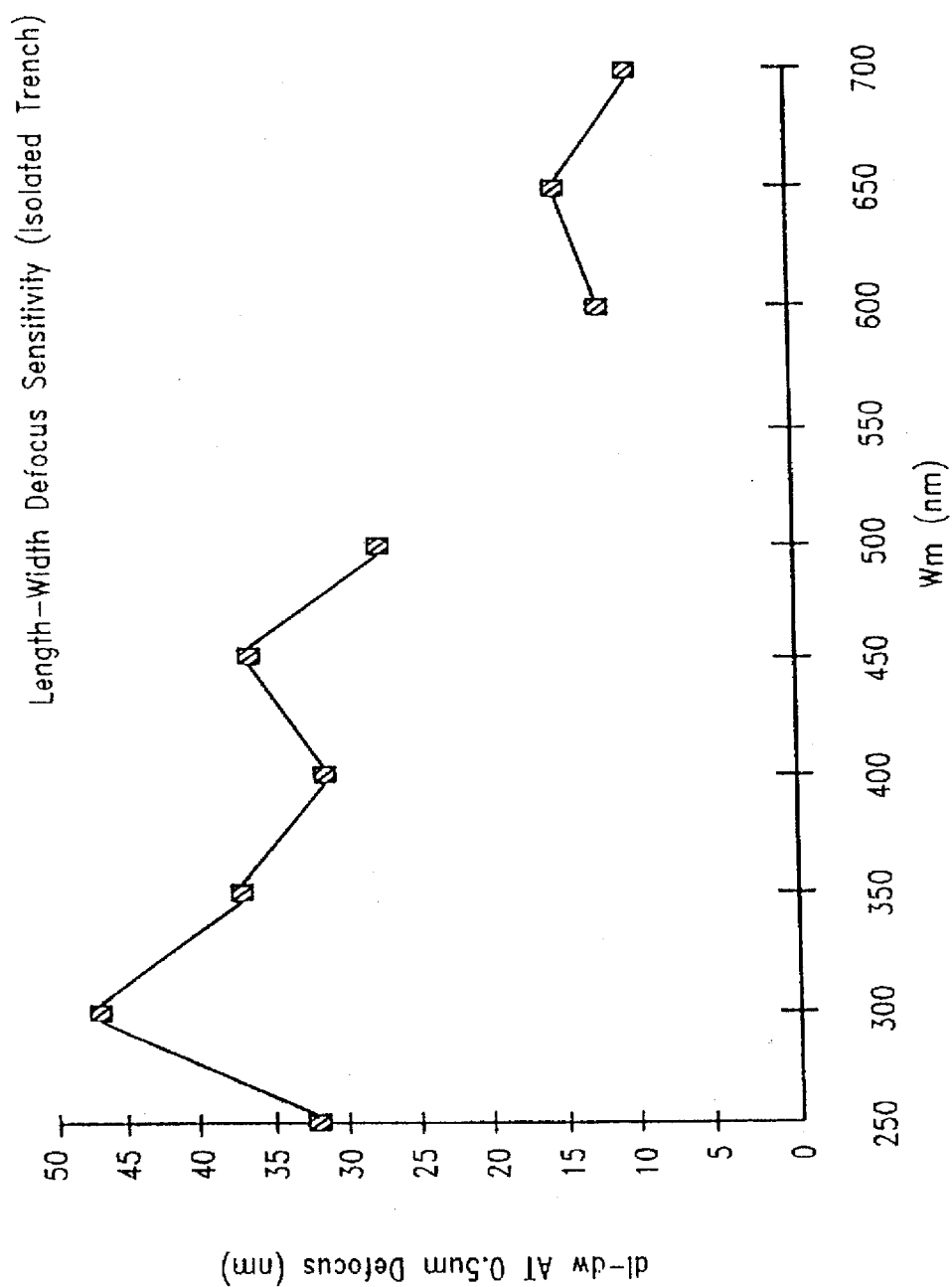
FIG. 7 is a plot of length-width sensitivity to defocus.

Further, as shown in FIG. 5, comparisons of the dependence of the length on focus to that of the width have also shown that the length shows significantly greater deviation from nominal with defocus. FIG. 6 shows the experimental data for an isolated trench of varying width and how the differential bias (length bias–width bias) sensitivity to exposure changes as a function of trench width. The data shows that length bias is at least equal or more sensitive to exposure than width bias and shows a trend with the minimum feature size. FIG. 7 shows a similar plot but this time, the defocus is varied. Again the experimental data shows that length bias is more sensitive and the width bias is predictable from length bias measurement.

Thus, it has been found that the length dimensions demonstrates greater sensitivity to exposure and focus than does the width dimension. The length sensitivity relative to the width increases as the nominal width decreases. As such, the higher sensitivity of the length relative to the width makes the length a more desirable dimension to monitor for the control of the lithographic patterning process. this is in contrast to conventional thinking and practice in which the width dimension has been measured for such control.

Figure 8:
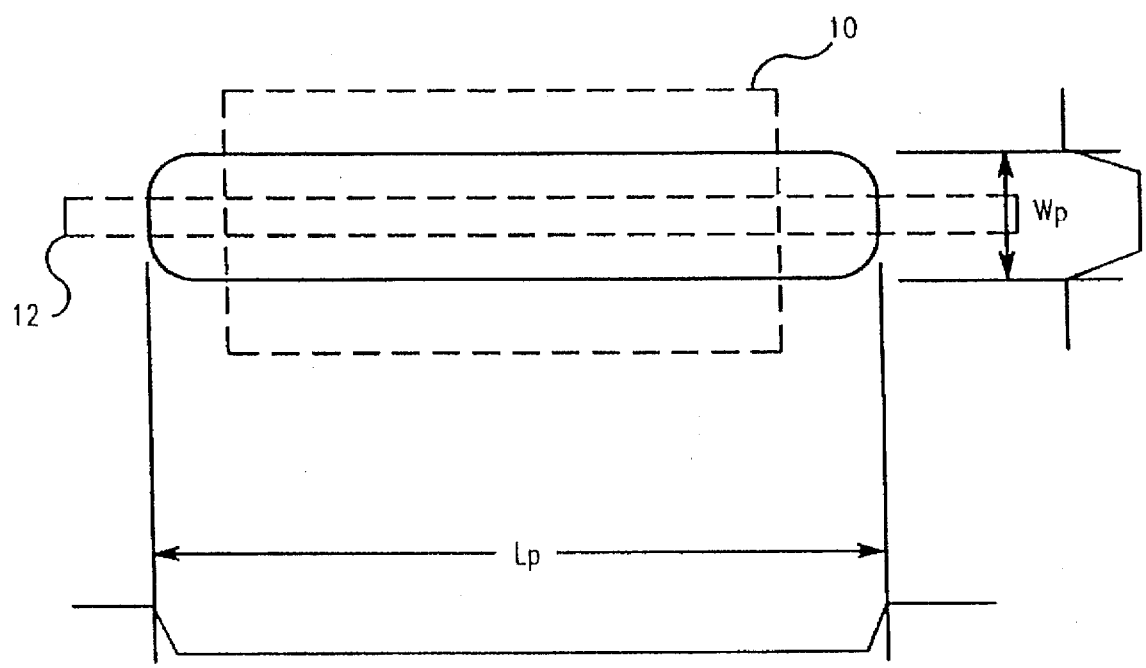
FIG. 8 is a schematic of a feature having a length and width dimension.

Reference is now made to FIG. 8. Length measurement poses a different set of problems than width measurement. In the width direction, the window 10 of the measurement tool can be set to integrate over a long length of the line or space pattern, as there exist many measurement pixels. In this case, the measurement obtained is insensitive to the positioning of the measurement window 10 relative to the pattern, particularly since the ends of the pattern, where tapering of the width occurs, can be avoided.

An equivalent length measurement would require setting the measurement window 12 to be much narrower than the pattern width. For narrow line or space patterns, for example, on the order of 250 nm, this means setting the measurement window 12 to be a relatively few pixels wide. In addition, the measurement obtained would be extremely sensitive to the positioning of the measurement window relative to the pattern, leading to a degradation of measurement precision and repeatability.

Bias Monitoring Using Image Shortening Effect Markings

In accordance with one aspect of the invention, there is provided an improved method of determining and controlling the critical dimensions of patterns used in semiconductor device manufacturing, which method utilizes image shortening markings. In this method, measurements are performed on a test pattern that is uniquely related to device dimensions, imaging capability and measurement capability.

Figure 9:
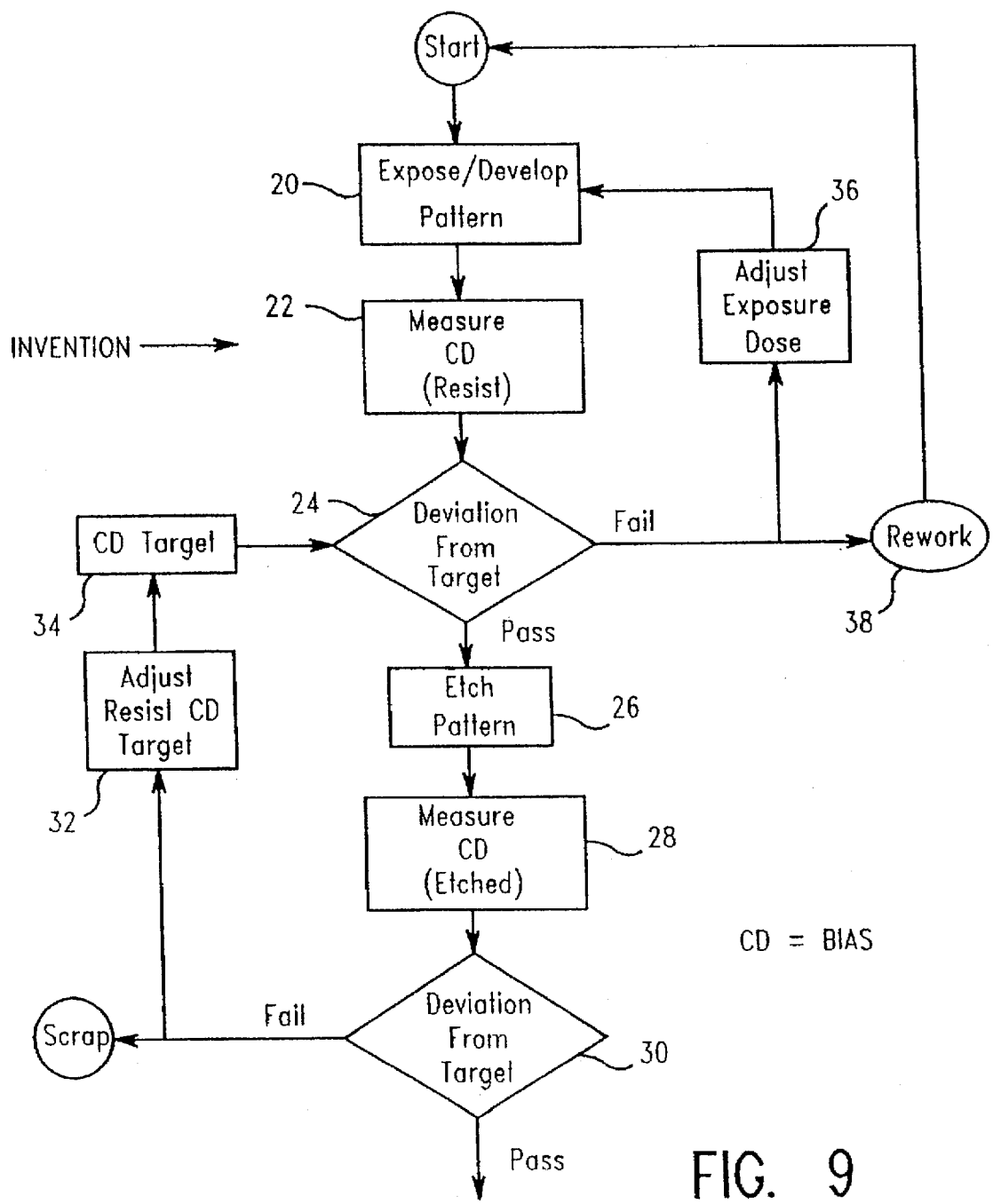
FIG. 9 is a flow chart of controlling lithography process by using bias (CD) measurement.

Referring now to FIG. 9, implementation of the invention will be described in the context of a typical lithography process using an optical stepper. At the START of the lithography process, at block 20, a wafer is coated with photoresist. The thickness of the photoresist is determined by the product imaging and etch requirements, and is typically in the range of 5,000 Å to 20,000 Å. A mask or reticle is then used to expose a pattern on the photoresist. The stepping pattern on the wafer is determined by the overall product pattern size and the image field size of the exposure tool. Typical image field sizes are greater than approximately 20,000 micrometers square. an appropriate image is projected onto the photoresist coated wafer, and developed so as to create a photoresist pattern. The nature of the wafer and process employed in the practice of the invention is dictated by the device being manufactured. Typical products have multiple pattern levels, with different patterns characterized by different design rules at each level. In accordance with the present invention, the photoresist pattern must contain one or more test pattern, which can be preferably located in an area of the image field outside of the product. The test patterns(s) will be described in greater detail herein below.

Figure 10:
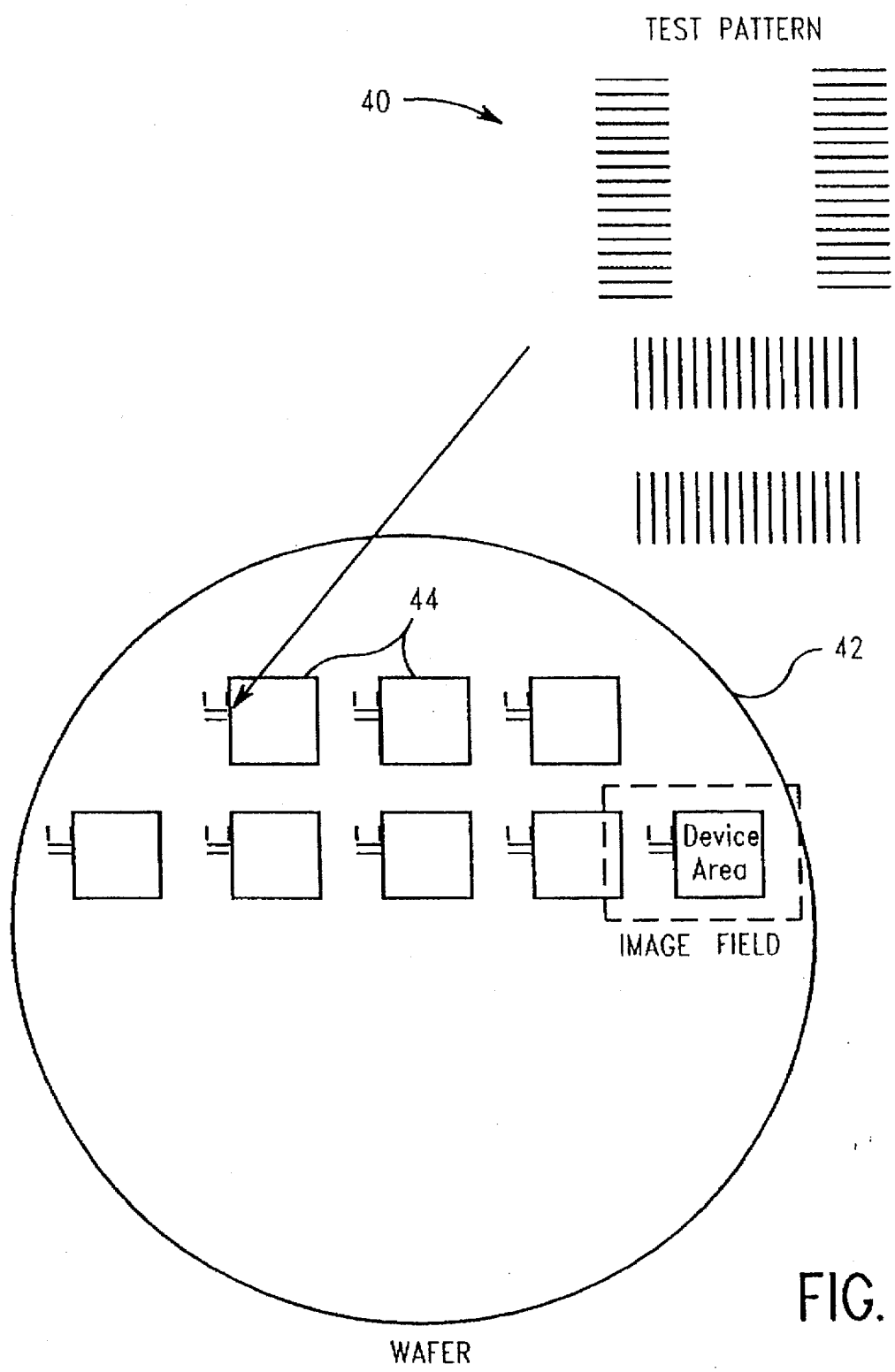
FIG. 10 is an implementation of a test pattern on a product wafer.

Referring now to FIG. 10, for product monitoring and control, the test pattern 40 must be printed in conjunction with the desired device pattern on the product wafer 42. To represent the product, the elements of the test pattern 40 should have a width and pitch smaller than or equal to (corresponding to) that of the most critical feature of the device pattern. Depending on the application, the test pattern 40 can contain a plurality of array lines, the minimum width and space of the arrays can be varied to cover a range of dimensions below and above the intended design minimum features or the minimum capability of the lithographic process and tool. At a minimum, at least one array of lines will constitute the test pattern. As shown in FIG. 10, the test patterns 40 can be distributed over any areas not occupied by the product patterns 44 and/or other requisite alignment and measurement patterns. Optionally, when resist/etch image characterization is the objective, similar test patterns of varying line width and patch can be distributed throughout the image field and wafer.

Figure 11:
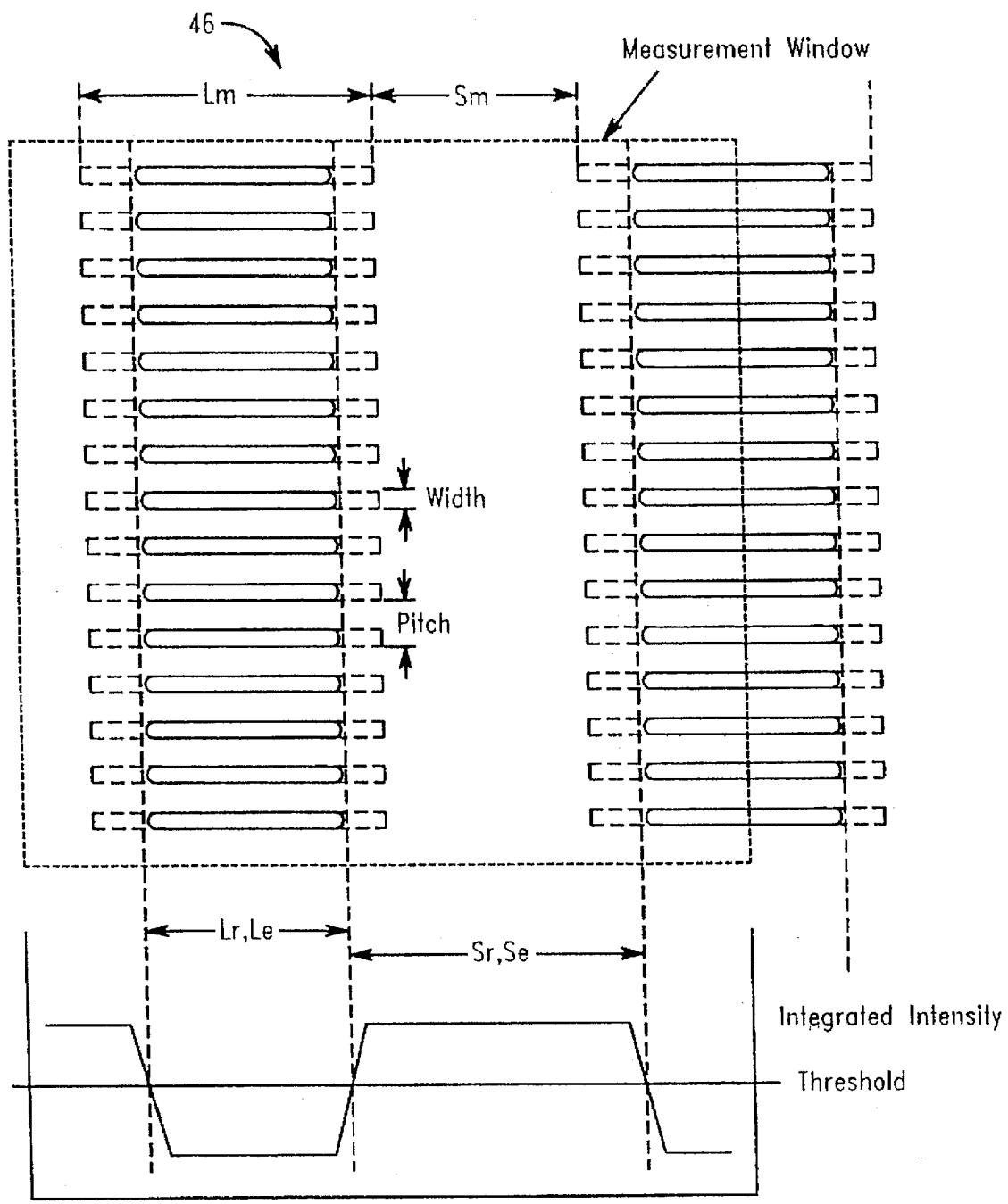
FIG. 11 is a test pattern usable for monitoring process.

An example of a test pattern layout that has been developed to be used in the practice of the invention is shown in FIG. 11. The basic components of the test pattern 46 are two line-space arrays separated by a gap, where the length ($L_m$) of the array elements and the separation or gap ($S_m$) between the two arrays must be within the resolution limit of the optical measurement system being used. Typically, optical measurement systems have resolution capabilities of greater than about 1 µm and, typically, $L_m=S_m=2$ µm.

The width and pitch (width+space) of the elements of the test pattern 46 are designed to be less than or equal to those of the most critical features of the product. The more aggressive the product ground rules, the smaller the width and pitch of the individual elements. As a specific example, in a state-of-the art semiconductor product having a 0.55 µm pitch and a minimum width of 0.25 µm on its pattern levels, two 15 element arrays were used as a test pattern. The arrays were comprised of 2 µm long elements, with a gap between arrays of 2 µm. The relative size and tone of the lines and spaces, and the tone of the surrounding area, was adapted to the tone and ground rule of the particular device level pattern being printed. Four combinations were used, depending on level:

(1) 0.25 µm wide chrome lines spaced 0.3 µm apart in a clear area.
(2) 0.3 µm wide chrome lines spaced 0.25 µm apart in a clear area.
(3) 0.25 µm wide clear lines spaced 0.3 µm apart in a chrome area.
(4) 0.3 µm wide clear lines spaced 0.25 µm apart in a chrome area.

Figure 13:
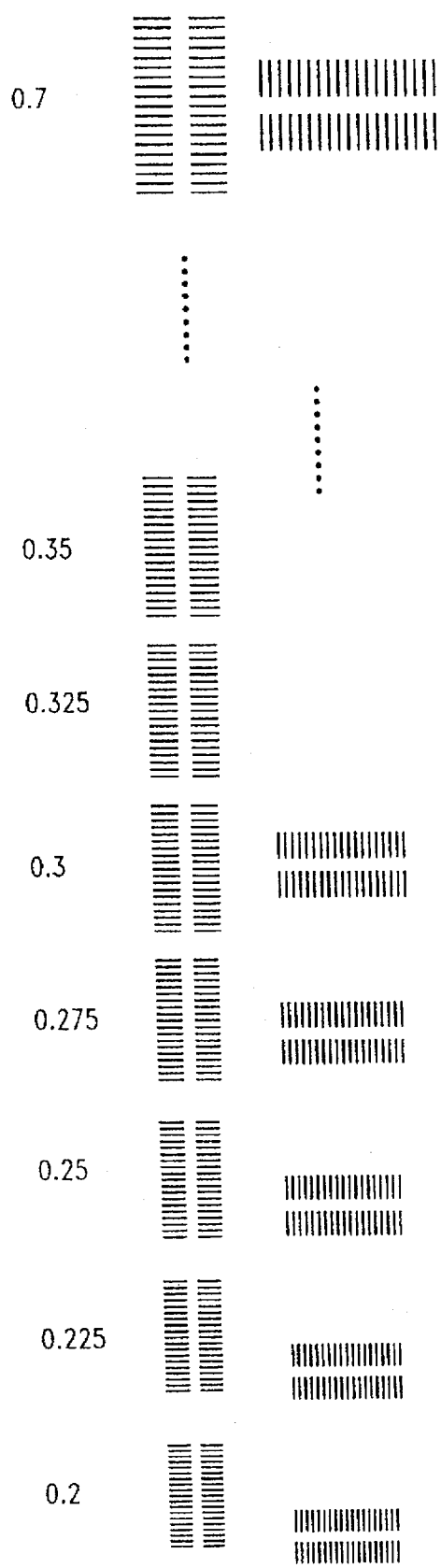
FIG. 13 is a test pattern comprising arrays of varying minimum features usable for process characterization.

The test pattern 46 was placed in both horizontal and vertical orientations at each location as shown in the test pattern 40 of FIG. 10 and also as shown in the test pattern of FIG. 13. The overall pattern size, including surrounding area was less than 20 µm×20 µm. Test patterns of varying feature size such as shown in FIG. 13 can be used to characterize process conditions, as they can provide process information simultaneously on different feature sizes.

As technology advances and smaller line widths and spaces can be printed, the lower limits on the element width and spacing may be reduced. However, the element length must be kept relatively large compared to the resolution limit of optical measurement systems. After the photoresist is developed, two measurements are performed on the length of the test pattern elements. Since the length is well resolved by an optical microscope, the specific means of measurement can be an optical tool, provided the measurement window is set to average over many elements of the test pattern array. The integrated intensity of the detected image is modulated by the pattern, such that the average end of the pattern elements can be located. The means of location can be a simple threshold technique, or a more sophisticated technique of fitting an a priori function to the detected image.

The two measurements of the resist image are 1) the average element length ($L_r$) in the pattern array, and 2) the average separation ($S_r$) between the two arrays. Given the corresponding mask values ($L_m$, $S_m$) the resist image bias ($B_r$) of the element length can be calculated by the average change in length and space dimensions of the array:

$$B_r=\{(L_r-S_r)-(L_m-S_m)\}/2 \qquad (1)$$

The measurements ($L_r$, $S_r$) also provide an automated means of monitoring the measurement precision ($P_r$). The pitch of the length and separation should be constant and equal in the mask and the resist printed. Therefore the term $P_r$ is defined as:

$$P_r=\{(L_r+S_r)-(L_m+S_m)\}/2 \qquad (2)$$

can be measured and calculated to check the integrity of measurement. Under ideal conditions $P_r$ is independent of $B_r$ and equal to zero. For good measurements, the range of $P_r$ should not exceed the measurement precision of the optical metrology tool, typically 10–20 nm. The value of $P_r$ determined from equation (2) is used as a criterion for culling bad measurements; e.g., those ($L_r$, $S_r$) for which $|P_r|>20$ nm are culled.

An important routine application of metrology measurement in manufacturing is to determine if a wafer needs to be reworked through the lithography process. If the features exceed a certain bias or are not resolved, it is more economical to rework the wafer at this point. This can be achieved as follows: The $B_r$ determined by measurement is compared to an a priori target resist image bias ($T_r$). $T_r$ is defined as the resist image bias that ensures optimum device performance. The deviation of measured resist image bias from target is defined as:

$$D_r=B_r-T_r \qquad (3)$$

This is used to monitor and control the resist imaging process. For a particular set of wafers (commonly referred to as a lot) measured, $D_r$ is the basis for deciding whether or not to move the lot to the next process.

If the mean and/or variation of $D_r$ over a lot of product wafers exceeds an acceptable tolerance (one that guarantees good device yield), the resist image "Fails" and the wafer(s) must be reworked in accordance with block 38 of FIG. 9. Rework entails stripping the resist, recoating and re-exposing the wafer(s) at a corrected dose. The dose correction is proportional to the mean of $D_r$. If $D_r$ is within an acceptable tolerance, the resist image "Passes", and the wafer(s) move on to the next process step.

As successive wafer lots are processed, statistical analysis applied to the within wafer, wafer-to-wafer and lot-to-lot variation of $D_r$, enables the dynamic feedback of dose corrections to the exposure tool and the automatic flagging of process changes. For example, dose corrections proportional to a running average of $D_r$ over multiple wafer lots can be fed back to the exposure tool in order to keep the dose synchronized with process variations affecting $D_r$.

At block 26, the next process step is typically an etch, in which the resist pattern is transferred to the underlying wafer. The etch step typically introduces an additional bias. Consequently, following the removal of all remaining resist, another measurement at block 28 is performed to ensure that the etched image is within acceptable tolerances.

In accordance with the invention, in a manner analogous to the resist image, the etched image ($L_e$, $S_e$) is measured on an optical tool, and the etch bias ($B_e$) and measurement precision ($P_e$) are defined as:

$$B_e=\{(L_e-S_e)-(L_m-S_m)\}/2 \quad (4)$$

$$P_e=\{(L_e+S_e)-(L_m+S_m)\}/2 \quad (5)$$

The bias of the etch relative to the resist ($B_x$) is also given by $$B_x=B_e-B_r \quad (6)$$

Thus, by successive measurement of the test site after resist image and after etching process one can determine the etch process bias.

At block 30, as in the case of the resist image, the measured etch bias ($B_e$) is compared to an a priori target etch image bias ($T_e$). $T_e$ is defined as the etch image bias that ensures optimum device performance. This target may differ from that of the resist image due to the relative bias inherent in the resist/etch process ($B_x$). Under ideal conditions the targets ($T_e$, $T_r$) differ by $B_x$. If the deviation of measured etch bias from target ($B_e-T_e$) exceeds an acceptable tolerance (one that guarantees good device yield), the etch image "Fails" and the wafer(s) must scrapped (rework is not possible post-etch).

As indicated at block 32, repeated etch image fails may indicate a need to adjust the resist CD (critical dimension) target due to a shift in the resist/etch bias.

If the deviation of $B_e-T_e$ is within an acceptable tolerance, the etch image "Passes", and the wafer(s) move on to the next process step.

Figure 12:
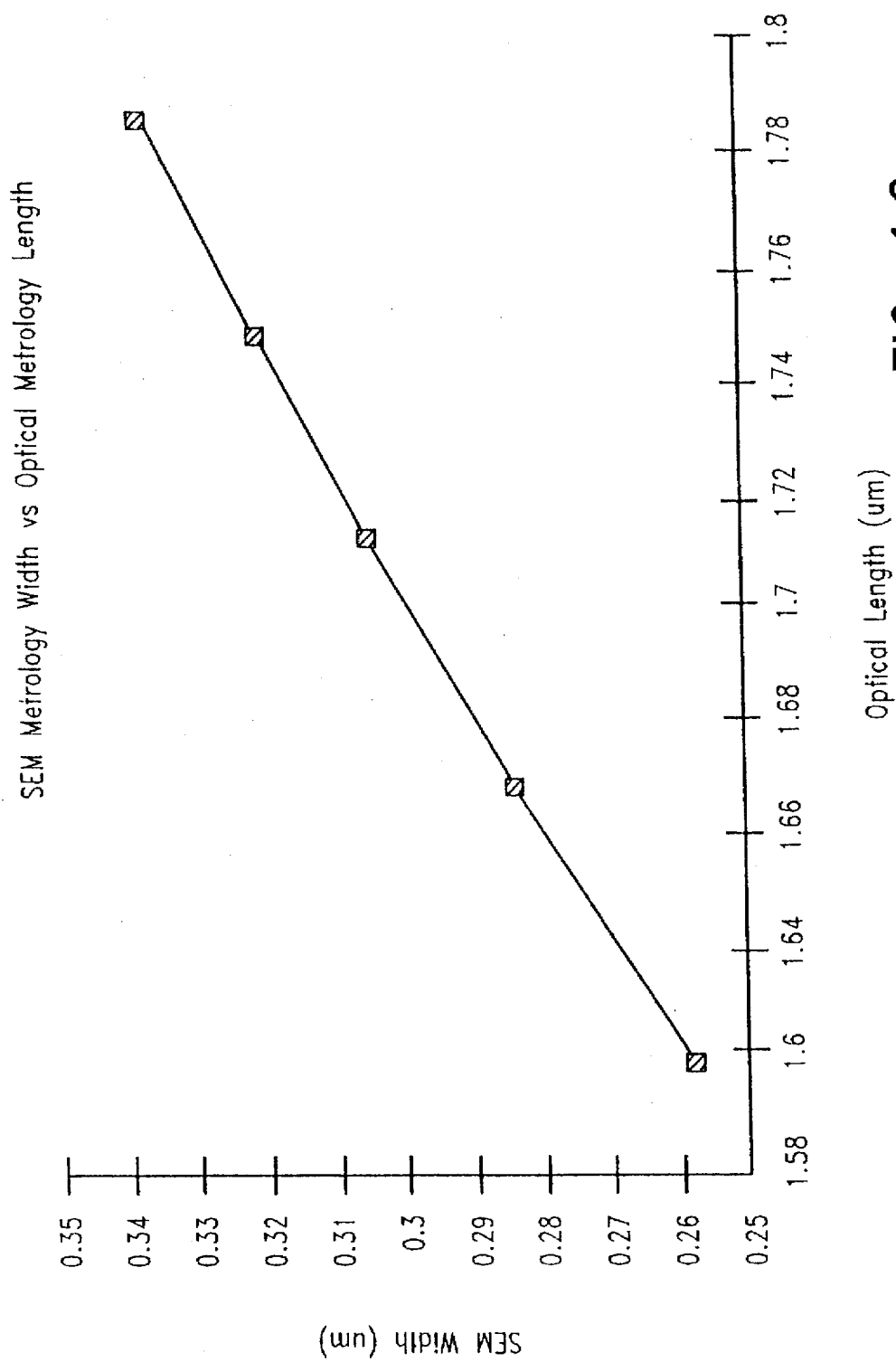
FIG. 12 is a plot of width of an array element measured on an SEM, against the corresponding array length measured on an optical metrology tool.

In summary, the aspect of the present invention utilizing image shortening effect markings enables the monitoring and control of product through accurate measurement of bias of a minimum feature and its distribution in a manufacturing wafer lot by use of unique test patterns at both resist image and etch image processing steps of each device level. The invention enables the use of metrology tools to measure and monitor designs whose minimum features are below the capability of the metrology tools. In specific, optical measurement tools can be used. For example, the variation in the minimum feature (width) can be inferred from the optically measured variation in the length. The relationship between the length and width regime can be characterized over the width regime of interest. FIG. 12 shows the characteristic relationship between the width (measured top down on an Opal SEM) of an element of a test pattern such as shown in FIG. 11, and the average length of the full array of elements (measured on a Biorad Optical Metrology System). In this case, the array elements were 0.3 µm×2 µm openings in resist at a 0.55 µm pitch. The variation in dimensions was achieved by changing exposure dose at a fixed focus. Over the range of variation, the relationship of length to width is linear. As noted earlier, the length changes more rapidly than the width. The sensitivity in this case is approximately 2:1, so that a 100 nm change in the length corresponds to a 50 nm change in the width.

In addition to the above-described dispositioning of product wafers, another application of the invention is for in-depth characterization of the resist/etch imaging process. In this case, the sampling of test patterns, in different pattern densities and orientations, over the image field and wafer, must be sufficient to determine the within field and across wafer image variation. An appropriate distribution of test patterns may not be possible on a product mask, due to the area occupied by the product device. In some cases, therefore, test masks devoted to arrays of test patterns may be needed. As shown earlier by data in FIGS. 4A, 4B and 5, the length measurement using the test pattern described in the present invention will provide equal or more sensitivity to monitoring and controlling the expose, develop and focus conditions at the minimum feature width of the design. Thus, the lithographic process can be easily monitored and adjusted using routine metrology tools than heretofore possible.

Another application of the present invention is in exposure tool/process development and determination of its capability in terms of the minimum feature size or minimum bias that the tool/process can be extended to. For this application a test pattern having arrays with line width and space of patterns distributed about the anticipated tool/process capability can be used. Using a test pattern such as shown in FIG. 13, a test site suitable for use with an exposure tool/process that is used with 0.35 µm minimum feature can be tested for extendibility to smaller feature size. The extendibility study can involve hardware change such as a different lens with a different numerical aperture, a different resist or a different software for focusing etc. By measuring the image shortening and using the bias of the length change as a function of the minimum feature of a specific array, the bias of the minimum feature can be calculated and compared to the target values for use. Similarly, the benefit of a hardware or process change can be quantified.

The method of the invention provides several advantages. First, better centering of the lithographic and etch process can be achieved, since the line lengths being measured according to the invention are more sensitive to process (exposure, focus, etch) variation than the widths measured according to conventional techniques. Second, the invention enables measurement at lower metrology tool resolution without loss of precision, since the element length and the number of elements comprising the test pattern array can be kept within the resolution capability of the tool, independent of the element width. In fact, there is no measurement limit on the minimum width of the element that can be monitored according to the invention. As the element width decreases, a greater number of pattern elements can be averaged at a given magnification, leading to an improvement in measurement precision. Third, the invention enables optical metrology to replace scanning electron (SEM) metrology in the routine resist/etch image dispositioning of product wafers. Optical measurement provides major advantages in speed, automation and equipment cost. The improved speed and automation of optical measurement relative to SEM measurement enables more measurements per wafer and, consequently a more thorough in-line characterization of the imaging process. Finally, the inherent redundancy of the technique enables the automated culling of bad measurements due to metrology tool failures, processing and test pattern defects.

Bias and Overlay Error Monitoring Using Vernier Markings

In another aspect of the present invention, there is provided an improved method and target using human- and machine-readable vernier markings to determine bias (critical dimension) and/or overlay error in manufacturing of semiconductor devices. While the measurement of critical dimension and overlay in the manufacture of advanced semiconductor devices is increasingly performed by automated measurement systems, e.g., optical and SEM metrology tools, nonetheless, there remains a crucial role for human readable verniers in the setup and calibration of metrology tools and the rapid verification of measurement results. Furthermore, the verniers employed according to this aspect of the present invention can be the basis for measurement itself, whether that measurement is manual or automated.

This aspect of the invention provides a solution to several problems:

(1) Prior art vernier designs cannot determine both level-to-level image size bias and overlay error, which are the components of "edge overlay", i.e., the key determinant of device functionality. It is difficult or impossible to measure the proximity of the edges of successive pattern levels by current techniques.

(2) Prior art critical dimension vernier designs do not monitor the length of the feature at minimum width. The length of the feature is the most sensitive indicator of process variation.

(3) Prior art vernier designs often violate product ground rules in the submicron regime.

The vernier marking configurations of the present invention provide a solution to the above problems.

Figure 14:
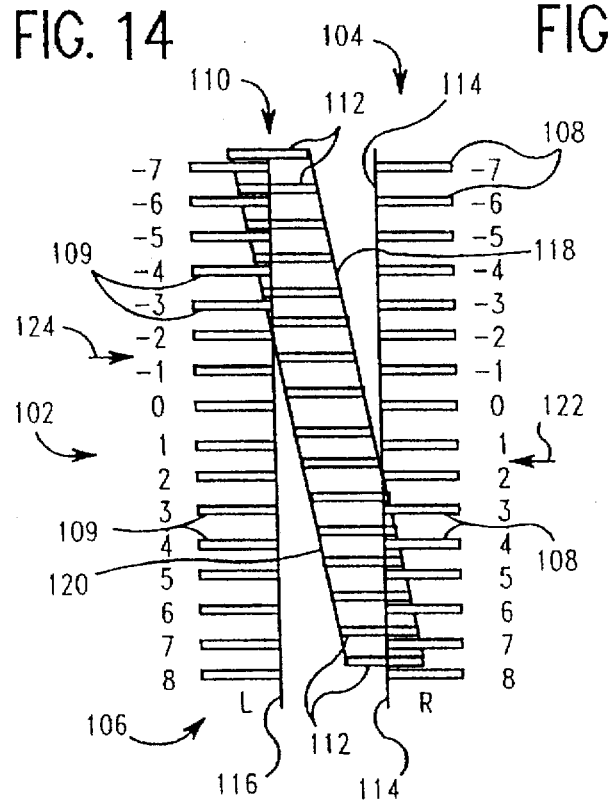
FIG. 14 is a test pattern incorporating vernier markings showing an undersize bias on a substrate.

The underlying mechanism of the vernier marking configurations of the present invention is the movement of the overlap among arrays of parallel lines or spaces (at the product ground rule width and pitch) when the position of successive lines in at least one of the arrays is staggered at a multiple N of the minimum grid size S of the mask used to create the pattern to be transferred to photoresist film on a substrate. As shown in FIG. 14, a vernier 102 is created by a pair of first, straight arrays 104, 106 of elements 108, 109, respectively, on which is overlaid on a second, staggered array 110 of elements 112. Elements 108, 109 have a length and a width, and are parallel and equally spaced. Preferably, in each element the element length is greater than the element width, although the elements may also be configured so that the length is equal to or smaller than the width. The ends of the elements are preferably aligned along straight lines and forming parallel array edges 114, 116, respectively. Similarly, parallel array edges 118, 120 are formed on staggered array 110 by the opposite ends of parallel, equally spaced elements 112 aligned along straight lines. Each of the elements in the arrays of vernier 102 may have the same length and the same width, as created originally by the mask or reticle pattern. Additionally, elements 108 of array 104 are aligned with elements 109 of array 106. The elements making up the arrays are projected on the photoresist layer of a wafer substrate to expose a vernier test pattern or target, adjacent to the desired device pattern (as shown in FIG. 10), which is subsequently developed and then later etched along with the pattern of the device being manufactured. The width of each element may be chosen to correspond to the minimum critical dimension of the lithographic process. For example, in the case of a 0.25 μm (0.55 μm pitch) ground rule product, the width of each element may be 0.25 μm, the length of each element may be 2 μm, and the spacing between adjacent elements may be 0.3 μm.

In this example, staggered array 110 may be located on a level B placed over and between the two straight arrays 104, 106 on an earlier level A, or vice versa. Alternatively, staggered array 110 and straight arrays 104, 106 may be exposed on the same level by patterning the mask such that the staggered array is on the side of an exposure field of a device pattern opposite that of the pair of straight arrays, and then interlocking the exposures of the arrays as the exposure field is stepped across one level of a substrate. The staggered and straight arrays may also be interlocked in the mask pattern itself, so that the vernier is created by a single exposure on a single level. However, this last example provides only critical dimensional measurement only and not overlay measurement, as will be explained further below. Where the staggered and straight arrays are created on the same level, for better readability it is preferred that the width of the elements in the arrays is smaller than the spacing between adjacent elements in the arrays, and that the elements in the staggered array be located equidistant between elements in the straight array, and vice-versa, so that the elements themselves in the different arrays do not contact each other when the arrays intersect. Where the staggered and straight arrays are created on different levels, or where the arrays are interlocked on the same level by stepping the exposure field, these requirements are unnecessary.

While the example vernier 102 is shown with a pair of straight arrays and one staggered arrays, other variations are possible in accordance with the broad teachings of the present invention. What is required is at least a pair of first arrays wherein at least one end of elements in each first array form a straight line at a first predetermined angle α with respect to the lengths of the elements. As shown in FIG. 14, this first angle is 90°. At least one second array of elements has ends of elements forming a straight line at a second predetermined angle β to the lengths of the elements, which second angle is different from the first angle. In FIG. 14, for purpose of illustration, the second angle is shown at approximately 80° (or 100°, depending on the side of the angle measured), such that array 112 has the aforenoted staggered configuration. It is possible for both angles α and β to be other than 90° and both sets of arrays be staggered. It is desirable for greater sensitivity and accuracy that the difference between angles α and β be a small as practical.

The overlap of the arrays defines two "daggers" formed by intersection of array edges 114 and 118 and 116 and 120. The dagger tips, indicated by arrows 122 and 124, respectively, move relative to one another depending on the image bias and/or overlay error created during exposure and/or etching of arrays 104, 166 and 110. Length markings or other indicia of distance may be added to interpret the vernier measurement. For example, in FIG. 14, if the mask from which the array elements were created had array 110 element 112 lengths equal to the distance between array 104 edge 114 and array 106 edge 116, then the indicated shrinkage of the length of elements 112 to less than the distance between array edges 114 and 116 indicates that the pattern on one or both of the level(s) on which arrays 104, 106 and array 110 were deposited was undersized. The location of the dagger tip indicated by arrow 122 at a point +1 on the opposite side of reference point 0 from the dagger tip indicated by arrow 124 at point −1 enables the user to quantify the degree of undersize bias.

Figure 15:
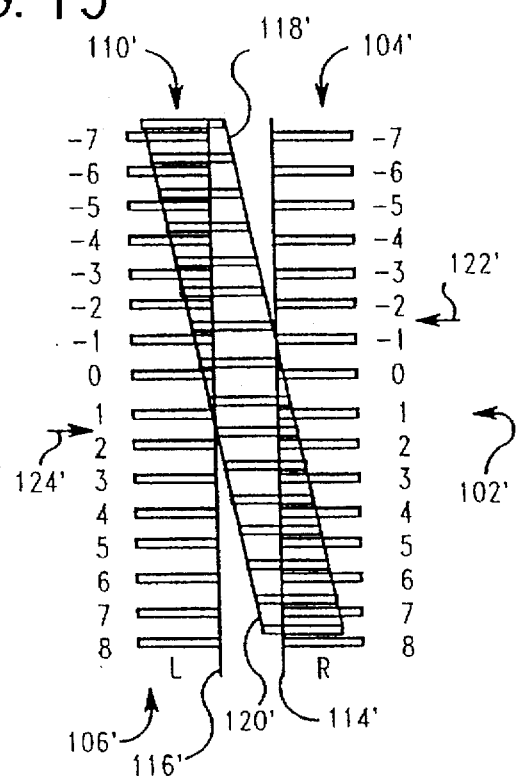
FIG. 15 is a test pattern incorporating vernier markings showing an oversize bias on a substrate.

FIG. 15 shows an opposite, oversize bias as measured by vernier 102', again assuming that the mask from which the array elements were created had array 110' element lengths equal to the distance between array 104' edge 114' and array 106' edge 116'. The indicated elongation of the length of the array 110 elements to greater than the distance between array edges 114' and 116' indicates that the pattern on one or both of the level(s) on which arrays 104', 106' and array 110' were deposited was oversized. The location of the dagger tip indicated by arrow 122' at a point −2 on the opposite side of reference point 0 from the dagger tip indicated by arrow 124 at point +2 enables the user to quantify the degree of oversize bias.

Figure 16:
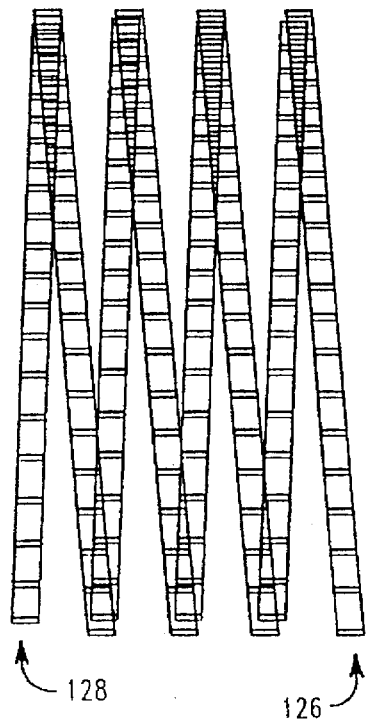
FIG. 16 is a vernier test pattern having multiple staggered and straight arrays of elements.

The use of a plurality of straight arrays 126 and a plurality of staggered arrays 128 is shown in FIG. 16. In the example shown, all elements of the arrays, as formed on the mask, have equal length and equal spacing, but the distance between the edges of adjacent straight or staggered arrays is greater than the length of the elements. The straight and staggered arrays are aligned with each other (i.e., the edges are coincident) at the top of the vernier, and diverge from each other as one moves downward until they are again aligned at the bottom, although shifted over one array.

While the staggered arrays have been depicted having nominal element length equal to the distance between facing sides of the straight arrays (FIGS. 14 and 15) or greater than the distance between facing sides of the straight arrays (FIG. 16), nominal element length on the mask can also be less than the distance between facing sides of the straight arrays.

The dagger tips define two intersection points ($P_1$, $P_2$) for each orientation. The mask bias (relative array element lengths) can be adjusted such that the tips are directly opposite one another when the relative bias between levels is on target. As the relative pattern size decreases (negative image bias), the daggers move away from one another. Conversely, as the relative pattern size increases, the daggers move toward one another. The bias B is proportional to the degree of separation of the intersection points and is given by the equation:

$$B = (P_1 - P_2) \times N \times S/2 \qquad (1)$$

where $P_1$ and $P_2$ are readable from the printed pattern, S is the minimum grid size of the lithographic pattern design being created and N is a selected integer corresponding to the number of minimum grid increments shifted during a step.

On the other hand, overlay error moves both daggers with respect to a nominal perfect overlay position ($P_1 + P_2 = 0$), without changing the distance between them. Overlay error is proportional to the sum of the locations of the intersection points relative to a fixed point on one or more of the arrays. Consequently, the overlay error O is given by the equation:

$$O = (P_1 + P_2) \times N \times S/2 \qquad (2)$$

Figure 17:
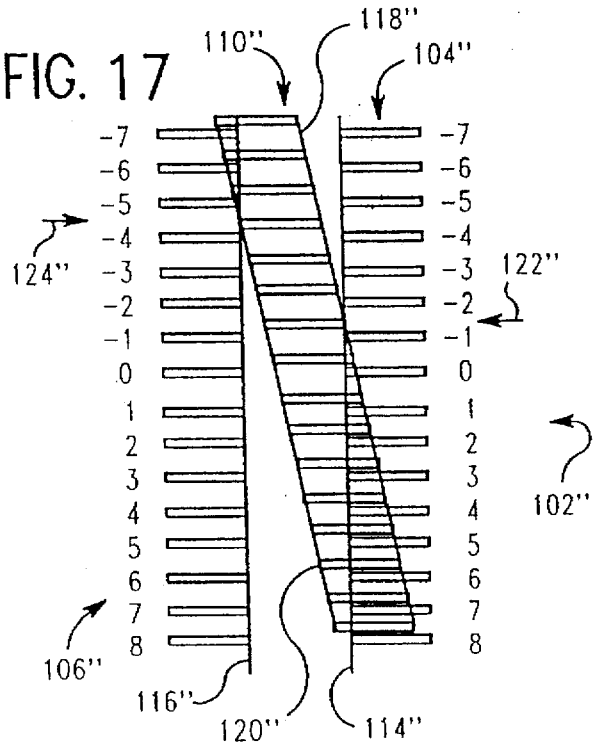
FIG. 17 is a test pattern incorporating vernier markings showing an undersize bias and overlay error on a substrate.

An example of both undersize and overlay error is shown in FIG. 17, wherein the dagger tips indicated by arrows 122" and 124" are located at points −2 and −5, respectively. This pattern indicates a shift to the right of array 110" with respect to arrays 104" and 106", which comprises an overlay error, as well as an undersize error.

The results of calculations (1) and (2) can be combined to determine the shift in relative position or edge overlay (E) of pattern edges on the two levels:

$$E+/- = B+/- O \qquad (3)$$

where E=0 corresponds to the situation where the relative position of all edges is as designed.

For example, if the patterns are undersized and there is an overlay error such that $P_1 = -4$, $P_2 = -1$ on the vernier of the present invention, and where $N \times S = 25$ nm, the bias and overlay is determined as follows:

$$B = (-4 - (-1)) * 12.5 = -37.5 \text{ nm}$$

$$O = (-4 + (-1)) * 12.5 = -62.5 \text{ nm}$$

so that the minimum and maximum shifts in relative pattern edge positions are:

$$E_{min} = 25 \text{ nm}$$

$$E_{max} = 100 \text{ nm}$$

In the above case, bias and overlay errors combine to cause a device failure if the level-to-level patterns are designed to overlap by less than 100 nm ($E_{max}$).

A simpler embodiment of the invention utilizes a single pattern containing both the A and B components interdigitated on the same level to monitor image size only. In such case, the $P_1$ and $P_2$ readings would be redundant (equal and opposite), since there is no possibility of an overlay error (O=0).

The preferred angle of the edge of one array in a vernier with respect to the edge of the other array in the vernier is determined by the pitch of the pattern of elements making up the array and the minimum grid spacing. The pitch PT of the pattern equals the sum of element width and element spacing in the array. The preferred angle θ of the edge of one array with respect to the edge of the other array in the vernier is given by the equation:

$$\theta = \tan^{-1}(N \times S/M \times PT) \qquad (4)$$

where M=1 in the situations where the staggered and straight arrays are created on different levels, or where the arrays are interlocked on the same level by stepping the exposure field, and M=2 where the staggered and straight arrays are created on the same level without stepping.

The arrays making up the vernier may be placed in both horizontal and vertical (X and Y directions) orientations to account for X and Y overlay error and astigmatism. In such instance, one set of first and second arrays is oriented such that the lengths of the elements are parallel to the X-axis in order to determine overlay error in the X direction. A second set of third and fourth arrays is provided, where the third array corresponds to the first array, and the fourth array corresponds to the second array, except that the lengths of the elements of the third and fourth arrays are parallel to the Y-axis. This other set of third and fourth arrays then simultaneously determines overlay error in the Y direction.

In all cases, the bias being measured by the vernier marking of the present invention is that of the length of the array element. Since, as described above, it has been found that the length is always a more sensitive indicator of process variation than the width, the relative sensitivity of the vernier of the present invention increases the closer the width approaches the resolution limit of the exposure tool.

As with the method and target using the image shortening effect markings discussed in connection with the block diagram of FIG. 9, vernier measurements made in accordance with this aspect of the invention may be made immediately after exposing and developing the device and associated vernier pattern on the substrate (to determine bias and/or overlay error due to the exposure process), as well as after etching the device and associated vernier pattern into the substrate (to determine bias and/or overlay error due to the etching process).

Figure 18:
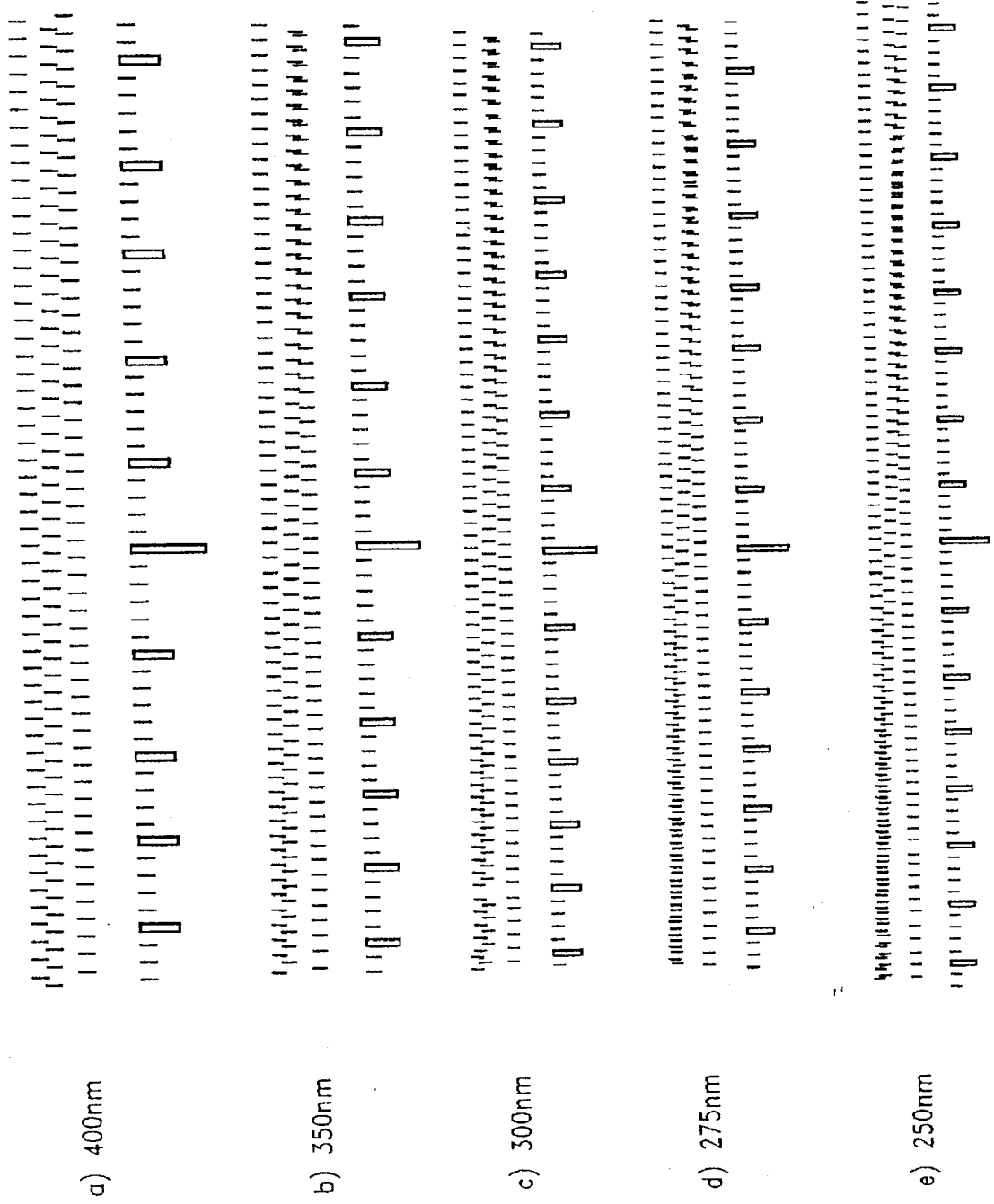
FIG. 18 is a series of vernier markings having decreasing element width and element spacing from (a) to (e).

FIG. 18 depicts a series of vernier markings according to the present invention in which have decreasing element width and spacing. The element width is shown to the left of each vernier, and ranges from 400 nm in FIG. 18(a) to 250 nm in FIG. 18(e). In each instance, the minimum mask grid size S is 25 nm. A plurality of such vernier test patterns or targets of decreasing element width (approaching critical minimum feature dimension) can be deposited to determine line shortening effects as well, which will be apparent by change in the location of calculated intersection points between staggered and straight arrays.

FIGS. 19a, 19b and 19c depict variations in element size and spacing between arrays in verniers constructed in accordance with the present invention. In FIG. 19a, element 129' length in staggered array 128' is greater than the distance or spacing between edges of adjacent straight arrays 126'. In FIG. 19b, element 129" length in staggered array 128" is less than the distance or spacing between edges of adjacent straight arrays 126". In FIG. 19c, element 129'" width is equal to element length, and the element length is less than the distance or spacing between edges of adjacent straight arrays 126'". These and other variations in element size with respect to spacing between arrays may be determined by the readability required according to the particular process and substrate measured.

Bias and Overlay Error Monitoring Using a Combination of Vernier and Image Shortening Effect Markings In a further aspect of the present invention, the method and target utilizing image shortening effect markings and vernier markings discussed previously may be combined to achieve improved measurement of bias, overlay error, and edge overlay error.

One embodiment of a combined image shortening/vernier marking target is depicted in FIG. 20. A first target portion 130 is shown comprised of arrays 132, 134, 136 and 138 oriented for measurement in the X direction (elements lengths parallel to the X-axis) and arrays 140, 142, 144 and 146 oriented for measurement in the Y direction (elements lengths parallel to the Y-axis). Opposite arrays are equidistant from target center point 131. Array pairs 132, 134, and 136, 138 have parallel adjacent array edges spaced apart from each other and comprise separate image shortening targets wherein the nominal distance between facing edges of the array pairs (on the mask or reticle) is a predetermined, selected value. Likewise, array pairs 140, 142 and 144, 146 have parallel adjacent array edges spaced apart from each other and also comprise separate image shortening targets arranged in a like manner. Further, array pairs 132, 138 and 140, 146 have opposite array edges oriented at the same, non-right angle to the array element lengths to form two sets of staggered arrays. Arrays 132, 138 have opposite parallel, angled edges 133, 139, respectively while arrays 140, 146 have opposite parallel, angled edges 141, 147, respectively, which will intersect with corresponding edges of other array pairs for vernier measurement, to be described below.

A second target portion 150 is shown in FIG. 20 in comprised of arrays 152, 154, 156 and 158 having element lengths parallel to the X-axis and arrays 160, 162, 164, 166 having element lengths parallel to the Y-axis. Opposite arrays are equidistant from target center point 151. Array pairs 152, 154; 156, 158; 160, 162 and 164, 166 have parallel adjacent edges and form separate sets of image shortening targets. Straight arrays 154, 156, 162 and 164 have respective edges 155, 157, 163 and 165 which are oriented 90° to the length of the elements within each array and which form the edges properly sized and located for intersection with the staggered edges (133, 139, 141, 147) of target portion 130 for vernier measurement in accordance with the present invention.

To determine edge overlay, the image of target portion 130 is exposed and etched on one level of a substrate and the image of target portion 150 is exposed and etched on a a different level of the substrate such that the center points 131, 151 of the target portions are coincident and the X and Y orientation of the respective element lengths are preserved (FIG. 21). In making such overlay, the outer, opposite edges of staggered arrays 132, 138 overlap and intersect with the inner, opposite edges of arrays 154, 156, respectively, and the outer, opposite edges of staggered arrays 140, 146 overlap and intersect with the inner, opposite edges of arrays 162, 164, respectively. As shown in more detail in FIG. 22, a measurement of location of intersection $P_1$ of staggered array edge 139 with straight array edge 157 may be made by visual observation. Likewise, a visual observation of opposite staggered array edge of location of intersection $P_2$ of staggered array edge 133 with straight array edge 155 may be made. With values for $P_1$ and $P_2$, the bias B and overlay error O may be calculated for the X direction as previously described. Likewise, bias B and overlay error O may be calculated for the Y direction by measurement of intersection of array edges 141 and 163, and 147 and 165. As also seen in FIG. 22, any image shortening effect may be determined for both levels by measurement of distance "a" between adjacent edges of arrays 136 and 138 and distance "b" between adjacent edges of arrays 156 and 158, and comparing these values with the nominal values established on the mask or reticle.

Thus, the present invention achieves to objects described above in providing human readable vernier and image shortening markings which may be used to determine the accuracy of overlay when depositing patterns on a substrate using a lithographic process. Furthermore, the method and targets described herein may be used in sub-0.5 micron product ground rules for determination of critical dimension, bias and overlay error with high measurement accuracy. Measurements may be made during processing to check both exposure and development of the desired device pattern and subsequent etching of the pattern into the wafer substrate.

The target depicted in FIGS. 20–22 may also be used as a direct replacement for a conventional box-in-box target. In prior art target configurations, a first target of four solid unconnected bars forming the sides of a box (without the corners) is created by a lithographic process on one level of a substrate. On a subsequent level, a similar, but larger (or smaller) target box of four solid unconnected bars is created. The center of the first target box is determined by measuring the center points (in the X and Y directions) between opposite bars. The center of the second target box is determined in a similar manner, and the locations of the centers are compared to determine whether the is an overlay error in the lithographic process between the first substrate layer and the second substrate layer. However, because of processing, large solid features such as the prior art bars may become distorted, which affects the center of box measurements.

In accordance with the present invention, a first target box consisting of arrays 134, 136, 142, 144 (FIGS. 20 and 21) may be created or deposited on a first layer of the substrate as described above. A second target box consisting of arrays 152, 158, 160, 166 is created or deposited on a second layer as described above. Using the edges of opposing arrays of each target box, the center of each target box may be determined and compared to determine overlay error. Since line shortening effects for the elements making up each array will be similar for each layer or level (where the element width is or approaches the critical feature dimension), the centers for each box will be consistent and may be accurately compared in both X and Y directions. The distortions which may affect prior art solid boxes do not affect the measurement of the target boxes made of arrays of individual elements.

Measurable Moiré Fringe Patterns Using Image Shortening Vernier Markings

In addition to direct measurement of overlap on vernier markings, the image shortening effect may be utilized with vernier markings to create a measurable moiré fringe pattern in yet another aspect of the present invention. The width of arrays on a substrate surface created by vernier markings having element width at the critical dimension is determined by the dose and focus conditions and the nature of the viewing system employed. A moiré fringe-type pattern may be created by viewing overlapping vernier markings comprised of a plurality of first and second arrays made up of discrete elements having a length and width, as previously described. The first and second arrays are at different angles, i.e., all of the first arrays are at one angle with respect to the parallel elements making up the arrays, and the second arrays are at another, different angle with respect to the parallel elements making up the arrays. By using elements whose widths correspond to the minimum critical dimensions or ground rules of the substrate being created by the lithographic process, the image shortening effect will cause the width of each array (i.e., the length of each element) will be determined by the bias (exposure, etch or both) of the process. By viewing the vernier markings at a relatively low magnification such that array edges are visible but the individual elements are not resolvable, a moiré fringe pattern will develop which corresponds to the overlap of the arrays. The degree of overlap, and the resultant fringe F created in the moiré fringe pattern, will then determine and measure the degree of bias in the process.

Different moiré fringe patterns are depicted in FIGS. 23–25. In FIG. 23, a first series of arrays 180 oriented at a first angle+1° with respect to vertical overlap a second series of arrays 182 oriented at a second angle–1° with respect to vertical. While the individual elements of arrays 180 and 182 as shown are not resolved, the edges of the arrays are still visible and indicate the ends of the lengths of the individual elements. The overlap or resulting fringe length $F_1$ is shown. In FIG. 24, overlapping arrays 180 and 182 have greater array widths (longer element lengths) is shown. Because of the greater element length and array width, the fringe $F_2$ in FIG. 24 is longer. Finally, FIG. 25 depicts arrays 180 and 182 having the greatest array width and element length, and the shortest fringe measurement $F_3$. Due to the line shortening effect of the individual elements comprising the arrays, bias differences cause the array width and fringe length to change depending on the degree of exposure and etching of the individual array elements. Bias may therefore be determined by comparing the fringe measurement F of an individual series of defocused vernier markings made on one level of a substrate in accordance with the present invention with the nominal fringe measurement determined beforehand. The degree of bias is proportional to the length of the fringe measurement F. In FIGS. 23–25, effective underexposure decreases from FIG. 23 to FIG. 24, and from FIG. 24 to FIG. 25.

Overlay error may also be determined. If the different overlaid arrays 180 and 182 are created on different levels, overlay error would cause a movement of the fringe center with respect to the ends of the pattern. Thus, overlay error is proportional to the location of the center of fringe measurement F relative to a fixed point on one or more of the arrays.

The use of vernier markings in arrays as described above amplifies both the sensitivity and the observability of the exposure effects so that a viewer may arrive at fringe measurements which determine bias and/or overlay error. The amplification factor A is determined by the equation:

$$A = PT/(N \times S) \quad (5)$$

For example, if the pitch of the elements in the vernier array is 500 nm, the minimum grid size is 25 nm, and N=1, the amplification is determined as:

$$A = 500/25 = 20$$

Thus when the length of the elements making up the vernier arrays decreases by 25 nm, the crossover point of the overlap between arrays moves by 500 nm. Arrays as shown in FIGS. 23–25 made up of elements of 0.3 μm width (the critical feature size) and 1.5 μm length may be viewed under blue illumination at 30× magnification to make the array edges clearly visible without resolving the individual array elements. The fringe measurements for bias and overlay error are both human- and machine-readable.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A target for determining bias or overlay error in a substrate formed by a lithographic process comprising:

a pair of first arrays of elements on a substrate, each first array comprising a plurality of spaced, substantially parallel elements having a length and a width, ends of each element in each first array being aligned along straight lines parallel to each other at a first angle to the length of each element and forming an array edge, said first arrays being spaced from each other and having substantially parallel array edges; and at least one second array of elements on a substrate, said second array comprising a plurality of spaced, substantially parallel elements having a length and a width, ends of said elements being aligned along straight lines parallel to each other at a second angle to the length of each element and forming at least two array edges;

said first and second arrays overlying each other such that:
   i) said elements of said first and second arrays are substantially parallel; ii) one of the edges of said second array intersects with one of the edges of one said first arrays; and iii) the other of the edges of said second array intersects with one of the edges of the other of said first arrays;

whereby said bias or overlay error is determinable by locating the points of intersection of the edges of said second array with the edges of said first arrays and measuring the degree of separation of the intersection points.

2. The target of claim 1 wherein the width of each of said elements corresponds to the minimum critical dimension of the lithographic process.

3. The target of claim 1 wherein the width and spacing of said elements in said first and second arrays are equal.

4. The target of claim 1 wherein the elements in each of said spaced first arrays are substantially aligned with each other.

5. The target of claim 1 wherein said first angle is 90 degrees and said second angle is greater or less than 90 degrees.

6. The target of claim 1 wherein said second angle is 90 degrees and said first angle is greater or less than 90 degrees.

7. The target of claim 1 wherein the bias is proportional to the difference between the locations of said intersection points relative to a fixed point on one of said arrays.

8. The target of claim 1 wherein the length of the elements of said arrays are parallel to an X-axis for determining said bias or overlay error in the X direction.

9. The target of claim 8 further including:
a pair of third arrays of elements on a substrate, each third array comprising a plurality of spaced, substantially parallel elements having a length and a width, ends of each element in each third array being aligned along straight lines parallel to each other at a third angle to the length of each element and forming an array edge, said third arrays being spaced from each other and having substantially parallel array edges; and
at least one fourth array of elements on a substrate, said fourth array comprising a plurality of spaced, substantially parallel elements having a length and a width, ends of said elements being aligned along straight lines parallel to each other at a fourth angle to the length of each element and forming at least two array edges; the length of the elements of said arrays being aligned along a Y-axis;
said third and fourth arrays overlying each other such that: i) said elements of said third and fourth arrays are substantially parallel; ii) one of the edges of said fourth array intersects with one of the edges of one said third arrays;
and iii) the other of the edges of said fourth array intersects with one of the edges of the other of said third arrays;
whereby said bias or overlay error is determinable in the Y direction by locating the points of intersection of the edges of said fourth array with the edges of said third arrays and measuring the degree of separation of the intersection points.

10. The target of claim 1 wherein the width of each of said elements is less than the length of each element.

11. The target of claim 1 wherein said first and second arrays are located on the same level on said substrate.

12. The target of claim 1 wherein said first and second arrays are located on different levels on said substrate.

13. The target of claim 9 wherein said second and fourth angles are 90 degrees and said first and third angles are greater or less than 90 degrees.

14. The target of claim 9 wherein the bias is proportional to the difference between the locations of said intersection points relative to a fixed point on one of said arrays.

15. The target of claim 9 wherein the overlay error is proportional to the sum of the locations of said intersection points relative to a fixed point on one of said arrays.

16. A target for determining bias or overlay error in a substrate formed by a lithographic process comprising:
a pair of first vernier arrays of elements on said substrate, each first array comprising a plurality of spaced, substantially parallel elements having a length and a width, ends of each element in each first array being aligned along straight lines parallel to each other at a first angle to the length of each element and forming an array edge, said first arrays being spaced from each other and having substantially parallel array edges;
at least one second vernier array of elements on said substrate, said second array comprising a plurality of spaced, substantially parallel elements having a length and a width, ends of said elements being aligned along straight lines parallel to each other at a second angle to the length of each element and forming at least two array edges;
at least one of said first or second vernier arrays having element width and spacing between adjacent elements corresponding to a minimum feature formed in said lithographic process;
said first and second vernier arrays overlying each other such that: i) said elements of said first and second arrays are substantially parallel; ii) one of the edges of said second array intersects with one of the edges of one said first arrays; and iii) the other of the edges of said second array intersects with one of the edges of the other of said first arrays; and
at least one image shortening array on said substrate, said image shortening array comprising a plurality of spaced, substantially parallel elements having a length and a width, the element width and spacing between adjacent elements corresponding to a minimum feature formed in said lithographic process, said image shortening array having ends of said elements forming an array edge spaced from the edge of said first or second vernier arrays having corresponding element width and element spacing;
whereby said bias or overlay error is determinable by: i) locating the points of intersection of the edges of said second vernier array with the edges of said first vernier arrays and measuring the degree of separation of the intersection points, and ii) measuring the separation between adjacent edges of the image shortening array and the one of the first or second vernier arrays having corresponding element width and element spacing.

17. The target of claim 16 wherein the width of each of said elements corresponds to the minimum critical dimension of the lithographic process.

18. The target of claim 16 wherein the width and spacing of said elements in said arrays are equal.

19. The target of claim 16 wherein the elements in each of said spaced first vernier arrays and said image shortening array are substantially aligned with each other.

20. The target of claim 16 wherein said first angle is 90 degrees and said second angle is greater or less than 90 degrees.

21. The target of claim 16 wherein said second angle is 90 degrees and said first angle is greater or less than 90 degrees.

22. The target of claim 16 wherein the bias is proportional to the difference between the locations of said intersection points relative to a fixed point on one of said arrays.

23. The target of claim 16 wherein the overlay error is proportional to the sum of the locations of said intersection points relative to a fixed point on one of said arrays.

24. The target of claim 16 wherein the length of the elements of said arrays are aligned parallel to an X-axis for determining said bias or overlay error in the X direction.

25. The target of claim 24 further including additional vernier and image shortening arrays having elements whose lengths are parallel to a Y-axis for determining said bias or overlay error in the Y direction.

26. The target of claim 16 wherein the width of each of said elements is less than the length of each element.

27. The target of claim 16 wherein said first and second vernier arrays are located on the same level on said substrate.

28. The target of claim 16 wherein said first and second vernier arrays are located on different levels on said substrate.

29. A target for determining overlay error in a substrate formed by a lithographic process comprising:
first and second sets of image shortening arrays on said substrate, each image shortening array comprising a plurality of spaced, substantially parallel elements having a length and a width, the element width and spacing between adjacent elements corresponding to a minimum feature formed in said lithographic process, said image shortening array having ends of said elements forming an array edge;

said first set of image shortening arrays located on one level of said substrate and comprising a first pair of said arrays having substantially parallel array edges and spaced from each other in an X direction and a second pair of said arrays having substantially parallel array edges and spaced from each other in a Y direction and;

said second set of image shortening arrays located on another level of said substrate and comprising a third pair of said arrays having substantially parallel array edges and spaced from each other in an X direction different from the X direction spacing of said first pair of arrays and a fourth pair of said arrays having substantially parallel array edges and spaced from each other in a Y direction different from the Y direction spacing of said second pair of arrays;

said first and second sets of arrays being overlaid such that each of said first and third pairs of arrays are separated in the X direction and each of said second and fourth pairs of arrays are separated in the Y direction, whereby overlay error is determinable by determining the center of each set of image shortening arrays using edges of each pair of arrays and measuring any difference between the centers of said first and second set of image shortening arrays.

30. The target of claim 29 wherein the width of each of said elements corresponds to the minimum critical dimension of the lithographic process.

31. The target of claim 29 wherein the width and spacing of said elements in said arrays are equal.

32. The target of claim 29 wherein the elements in each of said image shortening arrays are substantially aligned with each other.

33. The target of claim 29 wherein the width of each of said elements is less than the length of each element.

* * * * *